(12) United States Patent
Tokunaga et al.

(10) Patent No.: US 11,674,051 B2
(45) Date of Patent: Jun. 13, 2023

(54) STEPPED SUBSTRATE COATING COMPOSITION CONTAINING COMPOUND HAVING CURABLE FUNCTIONAL GROUP

(71) Applicant: NISSAN CHEMICAL CORPORATION, Tokyo (JP)

(72) Inventors: Hikaru Tokunaga, Toyama (JP); Takafumi Endo, Toyama (JP); Hiroto Ogata, Toyama (JP); Keisuke Hashimoto, Toyama (JP); Makoto Nakajima, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 102 days.

(21) Appl. No.: 16/647,146

(22) PCT Filed: Sep. 12, 2018

(86) PCT No.: PCT/JP2018/033862
§ 371 (c)(1),
(2) Date: Mar. 13, 2020

(87) PCT Pub. No.: WO2019/054420
PCT Pub. Date: Mar. 21, 2019

(65) Prior Publication Data
US 2021/0024773 A1    Jan. 28, 2021

(30) Foreign Application Priority Data
Sep. 13, 2017 (JP) .............................. JP2017-175633

(51) Int. Cl.
*C09D 163/00* (2006.01)
*G03F 7/11* (2006.01)
(Continued)

(52) U.S. Cl.
CPC .............. *C09D 163/00* (2013.01); *G03F 7/11* (2013.01); *G03F 7/2002* (2013.01); *G03F 7/26* (2013.01); *H01L 21/0274* (2013.01)

(58) Field of Classification Search
CPC ........... C09D 163/00; C09D 7/40; G03F 7/11; G03F 7/2002; G03F 7/26; G03F 7/039;
(Continued)

(56) References Cited
U.S. PATENT DOCUMENTS
2004/0048196 A1    3/2004    Shao et al.
2005/0008964 A1    1/2005    Takei et al.
(Continued)

FOREIGN PATENT DOCUMENTS
JP    2004-533637 A    11/2004
JP    2006-293207 A    10/2006
(Continued)

OTHER PUBLICATIONS
Nov. 20, 2018 International Search Report issued in International Patent Application No. PCT/JP2018/033862.
(Continued)

Primary Examiner — Caleen O Sullivan
(74) Attorney, Agent, or Firm — Oliff PLC

(57) ABSTRACT

A stepped substrate coating composition for forming a coating film having planarity on a substrate, including: a main agent and a solvent, the main agent containing a compound (A), a compound (B), or a mixture thereof, the compound (A) having a partial structure Formula (A-1) or (A-2):

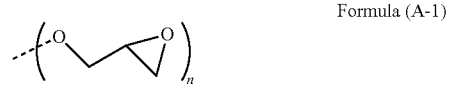

Formula (A-1)

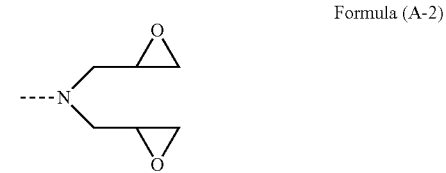

Formula (A-2)

and the compound (B) having at least one partial structure selected from Formulae (B-1)-(B-5), or having a partial structure including a combination of a partial structure of Formula (B-6) and a partial structure of Formula (B-7) or (B-8):

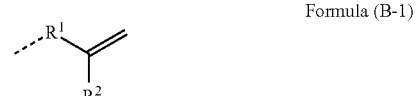

Formula (B-1)

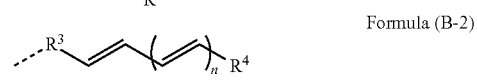

Formula (B-2)

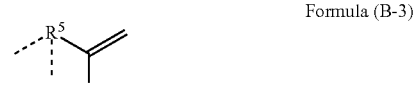

Formula (B-3)

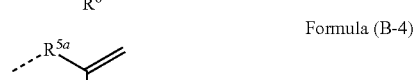

Formula (B-4)

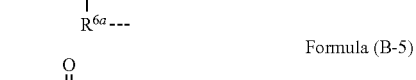

Formula (B-5)

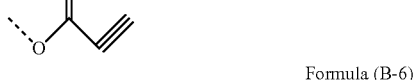

Formula (B-6)

(Continued)

-continued

Formula (B-7)

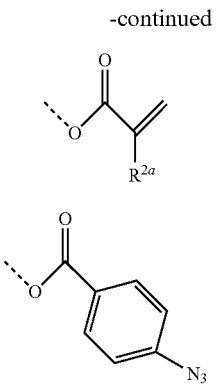

Formula (B-8)

where the composition is cured by photoirradiation or by heating at 30° C.-300° C.; and the amount of the main agent in the solid content of the composition is 95%-100% by mass.

27 Claims, No Drawings

(51) Int. Cl.
 G03F 7/20 (2006.01)
 G03F 7/26 (2006.01)
 H01L 21/027 (2006.01)
(58) Field of Classification Search
 CPC .......... G03F 7/094; G03F 7/2004; G03F 7/38; G03F 7/40; H01L 21/0274; H01L 21/0271; H01L 21/0332; H01L 21/027; C08G 8/28
 USPC .................. 430/270.1, 271.1, 272.1
 See application file for complete search history.

(56) References Cited

U.S. PATENT DOCUMENTS

| 2009/0162782 A1 | 6/2009 | Takei et al. |
| 2010/0022090 A1 | 1/2010 | Sakaguchi et al. |
| 2010/0022092 A1 | 1/2010 | Horiguchi et al. |
| 2010/0151382 A1 | 6/2010 | Hatakeyama |
| 2013/0189850 A1 | 7/2013 | Takei et al. |
| 2016/0336189 A1 | 11/2016 | Kori et al. |
| 2017/0018436 A1 | 1/2017 | Hatakeyama et al. |
| 2018/0086886 A1 | 3/2018 | Sakamoto et al. |

FOREIGN PATENT DOCUMENTS

| JP | 2016-216367 A | 12/2016 |
| JP | 2017-021337 A | 1/2017 |
| WO | 03/034152 A1 | 4/2003 |
| WO | 2006/115044 A1 | 11/2006 |
| WO | 2007/066597 A1 | 6/2007 |
| WO | 2008/047638 A1 | 4/2008 |
| WO | 2008/069047 A1 | 6/2008 |
| WO | 2009/008446 A1 | 1/2009 |
| WO | 2011/108365 A1 | 9/2011 |
| WO | 2016/159358 A1 | 10/2016 |

OTHER PUBLICATIONS

Nov. 20, 2018 Written Opinion issued in International Patent Application No. PCT/JP2018/033862.
Dec. 2, 2022 Decision of Refusal issued in Japanese Patent Application No. 2019-542271.

STEPPED SUBSTRATE COATING COMPOSITION CONTAINING COMPOUND HAVING CURABLE FUNCTIONAL GROUP

TECHNICAL FIELD

The present invention relates to a stepped substrate coating composition for forming a planarization film on a stepped substrate by photocrosslinking, and to a method for producing a laminated substrate that is planarized by using the stepped substrate coating composition.

BACKGROUND ART

In recent years, semiconductor integrated circuit devices have been processed with a fine design rule. Exposure light having a shorter wavelength must be used for formation of a finer resist pattern by an optical lithography technique.

However, the depth of focus decreases in association with the use of exposure light having a shorter wavelength, and thus the planarity of a coating film formed on a substrate must be improved. Thus, a technique for planarization of the film on the substrate has become important for the production of a semiconductor device having a fine design rule.

Hitherto disclosed planarization film formation methods include, for example, a method for forming a resist underlayer film below a resist film by photocuring.

A resist underlayer film-forming composition has been disclosed which contains a polymer having an epoxy group or an oxetane group in a side chain and a photo-cationic polymerization initiator, or contains a polymer having a radical polymerizable ethylenically unsaturated bond and a photo-radical polymerization initiator (see Patent Document 1).

A resist underlayer film-forming composition has been disclosed which contains a silicon-containing compound having a cationic polymerizable reactive group (e.g., an epoxy group or a vinyl group), a photo-cationic polymerization initiator, and a photo-radical polymerization initiator (see Patent Document 2).

A method for producing a semiconductor device has been disclosed, in which the device includes a resist underlayer film containing a polymer having a crosslinkable functional group (e.g., a hydroxy group) in a side chain, a crosslinking agent, and a photoacid generator (see Patent Document 3).

A resist underlayer film having an unsaturated bond in a main or side chain, which is not a photo-crosslinked resist underlayer film, has been disclosed (see Patent Documents 4 and 5).

PRIOR ART DOCUMENTS

Patent Documents

Patent Document 1: International Publication Pamphlet WO 2006/115044
Patent Document 2: International Publication Pamphlet WO 2007/066597
Patent Document 3: International Publication Pamphlet WO 2008/047638
Patent Document 4: International Publication Pamphlet WO 2009/008446
Patent Document 5: Japanese Unexamined Patent Application Publication (Translation of PCT Application) No. 2004-533637 (JP 2004-533637 A)

SUMMARY OF THE INVENTION

Problems to be Solved by the Invention

A conventional photo-crosslinkable material, for example, a resist underlayer film-forming composition containing a polymer having a thermally crosslinkable functional group such as a hydroxy group, a crosslinking agent, and an acid catalyst (acid generator) may pose the following problem. Specifically, when the composition is heated to fill a pattern (e.g., a hole or a trench structure) formed on a substrate, a crosslinking reaction proceeds, leading to an increase in viscosity, resulting in insufficient filling of the pattern with the composition. The composition may also pose a problem in terms of impaired planarity due to occurrence of thermal shrinkage caused by degassing.

Meanwhile, a resist underlayer film-forming composition containing a polymer having a cationic polymerizable reactive group (e.g., an epoxy group or a vinyl group) and an acid generator may pose a problem in terms of planarity due to occurrence of thermal shrinkage caused by degassing during photoirradiation and heating when a large amount of the acid generator is contained in the composition.

Thus, an object of the present invention is to provide a stepped substrate coating composition for forming a coating film having planarity on a substrate, wherein the composition can fill a pattern sufficiently and can form a coating film without causing degassing or thermal shrinkage.

Means for Solving the Problems

A first aspect of the present invention is a stepped substrate coating composition comprising a main agent and a solvent, the main agent containing a compound (A), a compound (B), or a mixture of these compounds, the compound (A) having a partial structure of the following Formula (A-1) or (A-2):

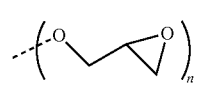
Formula (A-1)

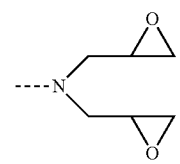
Formula (A-2)

(wherein n is an integer of 1 or 2; a broken line is a bond to an aromatic ring; and the aromatic ring is an aromatic ring forming a polymer skeleton or a monomer), and the compound (B) having at least one partial structure selected from the group consisting of partial structures of the following Formulae (B-1) to (B-5), or having a partial structure including a combination of a partial structure of the following Formula (B-6) and a partial structure of the following Formula (B-7) or (B-8):

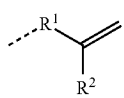
Formula (B-1)

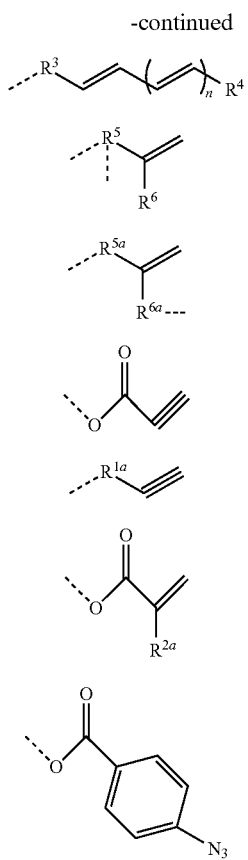

Formula (B-2)
Formula (B-3)
Formula (B-4)
Formula (B-5)
Formula (B-6)
Formula (B-7)
Formula (B-8)

(wherein $R^1$, $R^{1a}$, $R^3$, $R^5$, $R^{5a}$, and $R^{6a}$ are each independently a $C_{1-10}$ saturated hydrocarbon group, a $C_{6-40}$ aromatic hydrocarbon group, an oxygen atom, a carbonyl group, a sulfur atom, a nitrogen atom, an amide group, an amino group, or a group composed of any combination of these; $R_2$, $R^{2a}$, $R^4$, and $R^6$ are each independently a hydrogen atom, a $C_{1-10}$ saturated hydrocarbon group, a $C_{2-10}$ unsaturated hydrocarbon group, an oxygen atom, a carbonyl group, an amide group, an amino group, or a group composed of any combination of these; $R^2$, $R^{2a}$, $R^4$, and $R^6$ are each a monovalent group; $R^1$, $R^{1a}$, $R^3$, $R^{5a}$, and $R^{6a}$ are each a divalent group; $R^5$ is a trivalent group; n is a repeating unit number of 1 to 10; and a dotted line is a chemical bond to an adjacent atom), wherein when the main agent is used, the composition is cured by photoirradiation, or cured by heating at 30° C. to 300° C. during or after photoirradiation;

when the main agent contains the compound (B), the composition is cured by heating at 30° C. to 300° C. during or after photoirradiation; and the amount of the main agent in the solid content of the composition is 95% by mass to 100% by mass.

A second aspect of the present invention is the stepped substrate coating composition according to the first aspect, wherein the aromatic ring is a benzene ring, a naphthalene ring, or an anthracene ring.

A third aspect of the present invention is the stepped substrate coating composition according to the first or second aspect, wherein the polymer containing the aromatic ring is a polymer prepared by substitution of a hydroxyl group of a polymer having a hydroxyaryl novolac structure with an organic group of Formula (A-1) or (A-2).

A fourth aspect of the present invention is the stepped substrate coating composition according to the first or second aspect, wherein the monomer containing the aromatic ring is a monomer prepared by substitution of a hydroxyl group of the aromatic ring with an organic group of Formula (A-1) or (A-2).

A fifth aspect of the present invention is the stepped substrate coating composition according to any one of the first to fourth aspects, wherein, when the main agent is a mixture of the compound (A) and the compound (B), the ratio by mole of an epoxy group to a vinyl group is 100:1 to 1:100.

A sixth aspect of the present invention is the stepped substrate coating composition according to any one of the first to fifth aspects, wherein the composition further comprises an acid generator.

A seventh aspect of the present invention is the stepped substrate coating composition according to any one of the first to sixth aspects, wherein the composition further comprises a surfactant.

An eighth aspect of the present invention is a method for producing a coated substrate, the method comprising a step (i) of applying the stepped substrate coating composition according to any one of the first to seventh aspects to a stepped substrate; and a step (ii) of exposing the composition applied in the step (i) to light or heating the composition during or after light exposure.

A ninth aspect of the present invention is the method for producing a coated substrate according to the eighth aspect, wherein the method further comprises a step (ia) of heating the stepped substrate coating composition at a temperature of 70° C. to 400° C. for 10 seconds to five minutes after application of the composition in the step (i).

A tenth aspect of the present invention is the method for producing a coated substrate according to the eighth or ninth aspect, wherein light used for the light exposure in the step (ii) has a wavelength of 150 nm to 248 nm.

An eleventh aspect of the present invention is the method for producing a coated substrate according to any one of the eighth to tenth aspects, wherein the dose of exposure light in the step (ii) is 10 mJ/cm$^2$ to 5,000 mJ/cm$^2$.

A twelfth aspect of the present invention is the method for producing a coated substrate according to any one of the eighth to eleventh aspects, wherein the substrate has an open area (non-patterned area) and a patterned area of DENSE (dense) and ISO (coarse), and the pattern has an aspect ratio of 0.1 to 100.

A thirteenth aspect of the present invention is the method for producing a coated substrate according to any one of the eighth to twelfth aspects, wherein the difference in coating level (Bias) between the open area and the patterned area is 1 nm to 50 nm.

A fourteenth aspect of the present invention is a method for producing a semiconductor device, the method comprising a step of forming, on a stepped substrate, an underlayer film from the stepped substrate coating composition according to any one of the first to seventh aspects; a step of forming a resist film on the underlayer film; a step of irradiating the resist film with light or electron beams, or heating the resist film during or after irradiation with light or electron beams, and then developing the resist film, to thereby form a resist pattern; a step of etching the underlayer film with the formed resist pattern; and a step of processing a semiconductor substrate with the patterned underlayer film.

A fifteenth aspect of the present invention is the method for producing a semiconductor device according to the fourteenth aspect, wherein the stepped substrate has an open area (non-patterned area) and a patterned area of DENSE (dense) and ISO (coarse), and the pattern has an aspect ratio of 0.1 to 100.

A sixteenth aspect of the present invention is the method for producing a semiconductor device according to the fourteenth aspect, wherein the step of forming an underlayer film from the stepped substrate coating composition comprises a step (i) of applying the stepped substrate coating composition according to any one of the first to seventh aspects to the stepped substrate; and a step (ii) of exposing the composition applied in the step (i) to light or heating the composition during or after light exposure.

A seventeenth aspect of the present invention is the method for producing a semiconductor device according to the sixteenth aspect, wherein the method further comprises a step (ia) of heating the stepped substrate coating composition at a temperature of 70° C. to 400° C. for 10 seconds to five minutes after application of the composition in the step (i).

An eighteenth aspect of the present invention is the method for producing a semiconductor device according to the sixteenth or seventeenth aspect, wherein light used for the light exposure in the step (ii) has a wavelength of 150 nm to 248 nm.

A nineteenth aspect of the present invention is the method for producing a semiconductor device according to any one of the sixteenth to eighteenth aspects, wherein the dose of exposure light in the step (ii) is 10 mJ/cm$^2$ to 5,000 mJ/cm$^2$.

A twentieth aspect of the present invention is the method for producing a semiconductor device according to the fourteenth aspect, wherein the underlayer film formed from the stepped substrate coating composition has a difference in coating level of 1 nm to 50 nm.

A twenty-first aspect of the present invention is a method for producing a semiconductor device, the method comprising a step of forming, on a stepped substrate, an underlayer film from the stepped substrate coating composition according to any one of the first to seventh aspects; a step of forming a hard mask on the underlayer film; a step of forming a resist film on the hard mask; a step of irradiating the resist film with light or electron beams, or heating the resist film during or after irradiation with light or electron beams, and then developing the resist film, to thereby form a resist pattern; a step of etching the hard mask with the formed resist pattern; a step of etching the underlayer film with the patterned hard mask; and a step of processing a semiconductor substrate with the patterned underlayer film.

A twenty-second aspect of the present invention is the method for producing a semiconductor device according to the twenty-first aspect, wherein the stepped substrate has an open area (non-patterned area) and a patterned area of DENSE (dense) and ISO (coarse), and the pattern has an aspect ratio of 0.1 to 100.

A twenty-third aspect of the present invention is the method for producing a semiconductor device according to the twenty-first aspect, wherein the step of forming an underlayer film from the stepped substrate coating composition comprises a step (i) of applying the stepped substrate coating composition according to any one of the first to seventh aspects to the stepped substrate; and a step (ii) of exposing the composition applied in the step (i) to light or heating the composition during or after light exposure.

A twenty-fourth aspect of the present invention is the method for producing a semiconductor device according to the twenty-third aspect, wherein the method further comprises a step (ia) of heating the stepped substrate coating composition at a temperature of 70° C. to 400° C. for 10 seconds to five minutes after application of the composition in the step (i).

A twenty-fifth aspect of the present invention is the method for producing a semiconductor device according to the twenty-third or twenty-fourth aspect, wherein light used for the light exposure in the step (ii) has a wavelength of 150 nm to 248 nm.

A twenty-sixth aspect of the present invention is the method for producing a semiconductor device according to any one of the twenty-third to twenty-fifth aspects, wherein the dose of exposure light in the step (ii) is 10 mJ/cm$^2$ to 5,000 mJ/cm$^2$.

A twenty-seventh aspect of the present invention is the method for producing a semiconductor device according to the twenty-first aspect, wherein the underlayer film formed from the stepped substrate coating composition has a difference in coating level of 1 nm to 50 nm.

Effects of the Invention

A stepped substrate coating composition is applied onto a stepped substrate, and optionally reflowed by further heating, so that a pattern is filled with the composition. Since the stepped substrate coating composition of the present invention does not contain a thermally crosslinkable moiety, the viscosity of the composition does not increase during use. Thus, a flat film can be formed on the stepped substrate regardless of an open area (non-patterned area) or a patterned area of DENSE (dense) and ISO (coarse) on the substrate. According to the stepped substrate coating composition of the present invention, a crosslinked structure is formed through polymerization between epoxy groups by photoirradiation or heating during or after photoirradiation of the epoxy group-containing compound contained in the composition, or formed between epoxy groups or unsaturated bonds by cationic species or radical species generated through photoirradiation. Thus, a crosslinked structure can be formed by reaction between carbon-carbon double or triple bonds derived from an epoxy group or an unsaturated group in a stepped substrate coating film (planarization film) formed through application of the stepped substrate coating composition of the present invention.

In the stepped substrate coating film (planarization film) formed from the stepped substrate coating composition of the present invention, no crosslinking reaction through a crosslinking agent and an acid catalyst occurs during thermal reflow. Subsequent photocrosslinking (i.e., photoreaction associated with no degassing) does not cause thermal shrinkage. Thus, the stepped substrate coating composition of the present invention can achieve sufficient filling of a pattern and good planarity after filling of the pattern, to thereby form an excellent planarization film.

In the case where photocuring does not completely proceed to the bottom of a film formed through application of the stepped substrate coating composition of the present invention, when the film of the stepped substrate coating composition is heated after photoirradiation or an upper hard mask or resist is applied onto the film, the flowage of an uncured portion may cause impairment of the planarity of the film of the stepped substrate coating composition of the present invention.

Since a crosslinked structure formed by an epoxy group is stronger than a crosslinked structure formed by an unsaturated bond, the flowage of an uncured portion is prevented, and shrinkage is reduced in the film. This probably suppresses impairment of the planarity of the film after application of a silicon-containing composition for forming a hard mask (i.e., upper coating layer) onto the film.

MODES FOR CARRYING OUT THE INVENTION

The present invention is directed to a stepped substrate coating composition comprising a main agent and a solvent, the main agent containing a compound (A), a compound (B), or a mixture of these compounds, the compound (A) having a partial structure of the following Formula (A-1) or (A-2):

Formula (A-1)

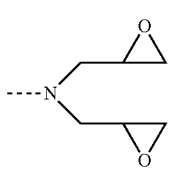

Formula (A-2)

and the compound (B) having at least one partial structure selected from the group consisting of partial structures of the following Formulae (B-1) to (B-5), or having a partial structure including a combination of a partial structure of the following Formula (B-6) and a partial structure of the following Formula (B-7) or (B-8):

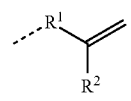

Formula (B-1)

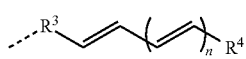

Formula (B-2)

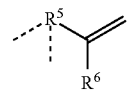

Formula (B-3)

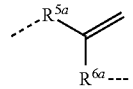

Formula (B-4)

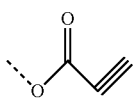

Formula (B-5)

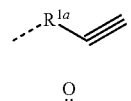

Formula (B-6)

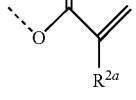

Formula (B-7)

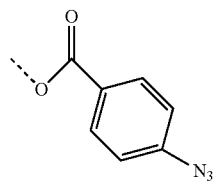

Formula (B-8)

wherein when the main agent contains the compound (A) or both the compound (A) and the compound (B), the composition is cured by photoirradiation, or cured by heating at 30° C. to 300° C. during or after photoirradiation;

when the main agent contains the compound (B), the composition is cured by heating at 30° C. to 300° C. during or after photoirradiation; and the amount of the main agent in the solid content of the composition is 95% by mass to 100% by mass.

In Formula (A-1), n is an integer of 1 or 2; a broken line is a bond to an aromatic ring; and the aromatic ring is an aromatic ring forming a polymer skeleton or a monomer.

In Formulae (B-1) to (B-8), $R^1$, $R^{1a}$, $R^3$, $R^5$, $R^{5a}$, and $R^{6a}$ are each independently a $C_{1-10}$ saturated hydrocarbon group, a $C_{6-40}$ aromatic hydrocarbon group, an oxygen atom, a carbonyl group, a sulfur atom, a nitrogen atom, an amide group, an amino group, or a group composed of any combination of these; $R^2$, $R^{2a}$, $R^4$, and $R^6$ are each independently a hydrogen atom, a $C_{1-10}$ saturated hydrocarbon group, a $C_{2-10}$ unsaturated hydrocarbon group, an oxygen atom, a carbonyl group, an amide group, an amino group, or a group composed of any combination of these; $R^2$, $R^{2a}$, $R^4$ and $R^6$ are each a monovalent group; $R^1$, $R^{1a}$, $R^3$, $R^{5a}$, and $R^{6a}$ are each a divalent group; $R^5$ is a trivalent group; n is a repeating unit number of 1 to 10; and a dotted line is a chemical bond to an adjacent atom.

The aforementioned stepped substrate coating composition has a solid content of 0.1 to 70% by mass, or 0.1 to 60% by mass, or 0.2 to 30% by mass, or 0.3 to 15% by mass. The "solid content" as used herein corresponds to the total amount of all components of the stepped substrate coating composition, except for the amount of the solvent.

The aforementioned aromatic ring may be a benzene ring, a naphthalene ring, or an anthracene ring.

The polymer containing the aromatic ring may be prepared by substitution of a hydroxyl group of a polymer having a hydroxyaryl novolac structure with an organic group of Formula (A-1) or (A-2). The aryl group may be an aromatic group derived from benzene or naphthalene.

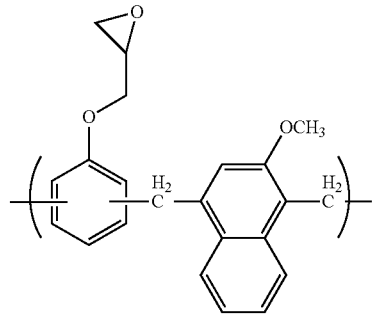

Formula (a-1)

Formula (a-2)
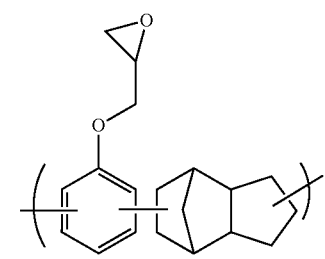
Formula (a-3)
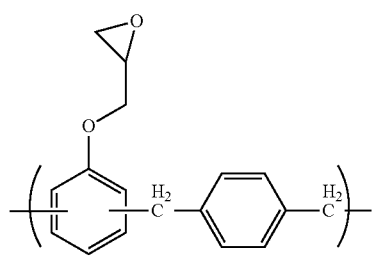
Formula (a-4)
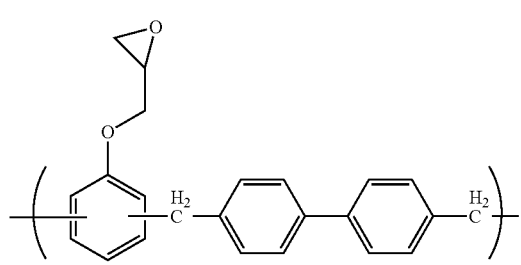
Formula (a-5)
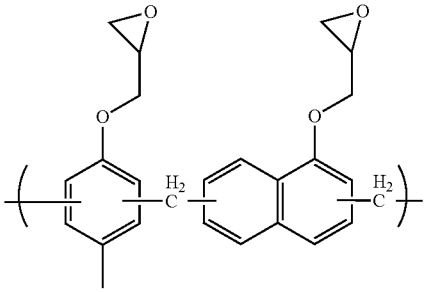
Formula (a-6)
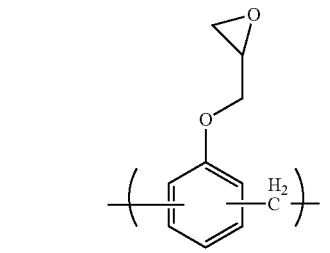
Formula (a-7)
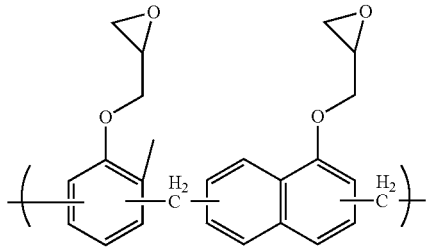
Formula (a-8)
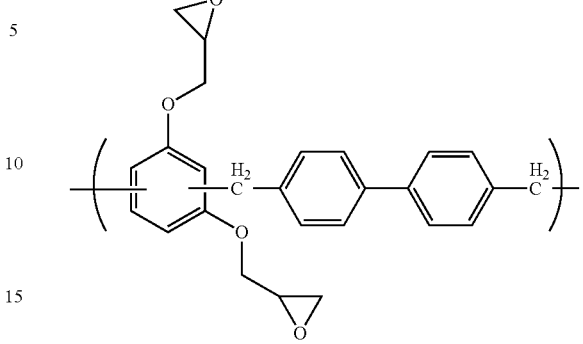
Formula (a-9)
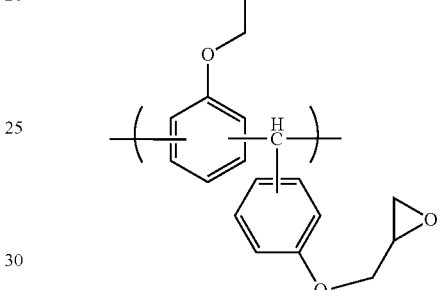
Formula (a-10)
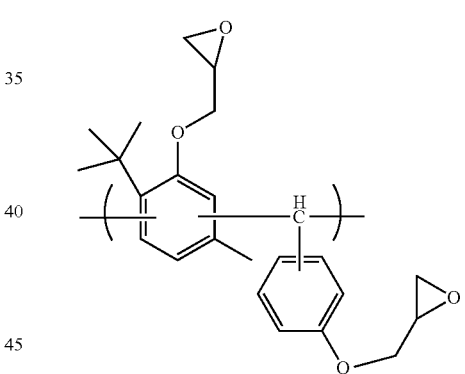
Formula (a-11)
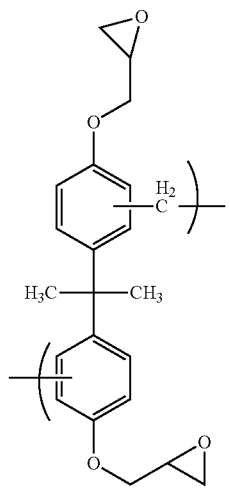

Formula (a-12)

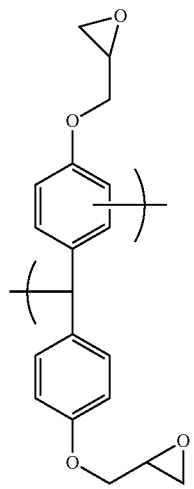

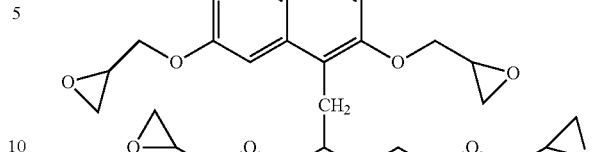
Formula (aa-1)

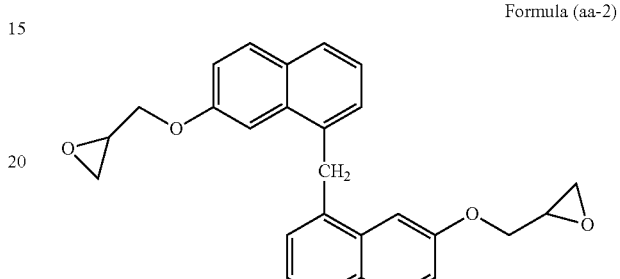
Formula (aa-2)

The polymer of Formula (a-1) can be obtained as trade name HP-5000 or HP-5000L available from DIC Corporation.

The polymer of Formula (a-2) can be obtained as trade name HP-7200 available from DIC Corporation.

The polymer of Formula (a-3) can be obtained as trade name NC-2000-L available from Nippon Kayaku Co., Ltd.

The polymer of Formula (a-4) can be obtained as trade name NC-3000-L available from Nippon Kayaku Co., Ltd.

The polymer of Formula (a-5) can be obtained as trade name NC-7000L available from Nippon Kayaku Co., Ltd.

The polymer of Formula (a-6) can be obtained as trade name EPPN-201 available from Nippon Kayaku Co., Ltd.

The polymer of Formula (a-7) can be obtained as trade name NC-7300L available from Nippon Kayaku Co., Ltd.

The polymer of Formula (a-8) can be obtained as trade name NC-3500 available from Nippon Kayaku Co., Ltd.

The polymer of Formula (a-9) can be obtained as trade name EPPN-501H available from Nippon Kayaku Co., Ltd.

The polymer of Formula (a-10) can be obtained as trade name FAE-2500 available from Nippon Kayaku Co., Ltd.

The polymer of Formula (a-11) can be obtained as trade name Polyfunctional Epoxy Resin 157 available from Mitsubishi Chemical Corporation.

The polymer of Formula (a-12) can be obtained as trade name Polyfunctional Epoxy Resin 1032 available from Mitsubishi Chemical Corporation.

Each of the aforementioned polymers has a weight average molecular weight of 600 to 1,000,000, or 600 to 200,000, or 1,500 to 15,000.

In the present invention, the monomer containing the aromatic ring may be prepared by substitution of a hydroxyl group of the aromatic ring with an organic group of Formula (A-1) or (A-2).

The hydroxyl group of the aromatic ring may be, for example, a hydroxyl group of phenol or naphthol.

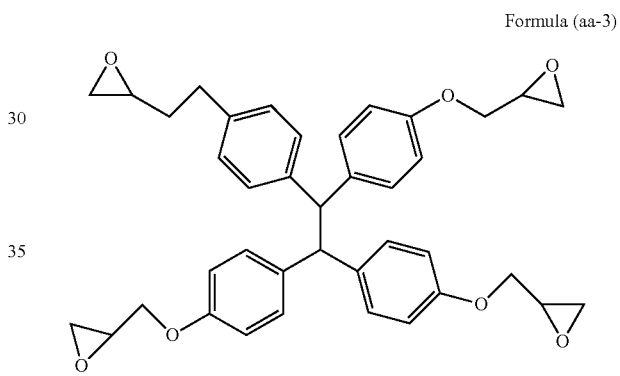
Formula (aa-3)

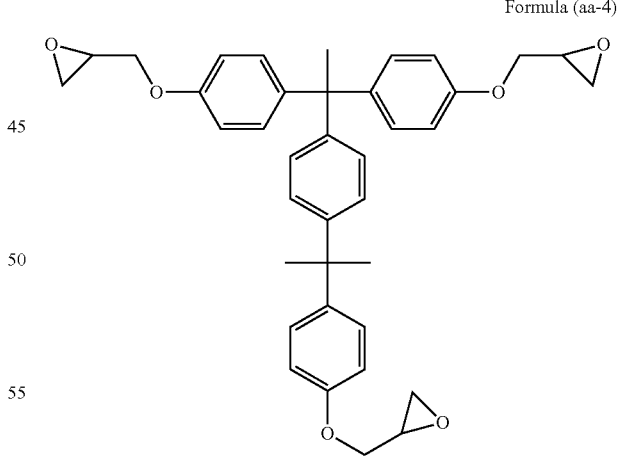
Formula (aa-4)

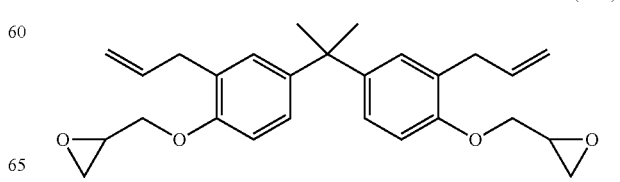
Formula (aa-5)

Formula (aa-6)
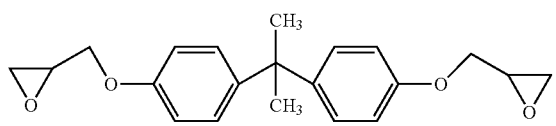

Formula (aa-7)
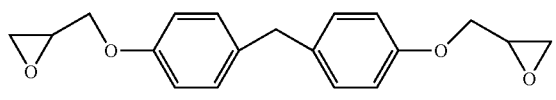

Formula (aa-8)
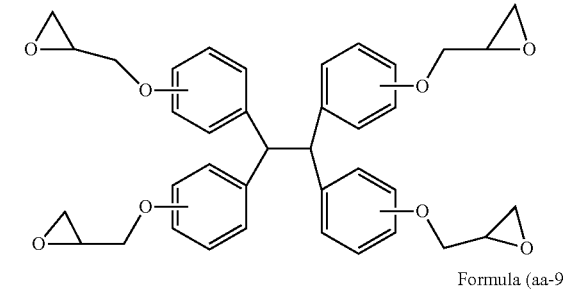

Formula (aa-9)
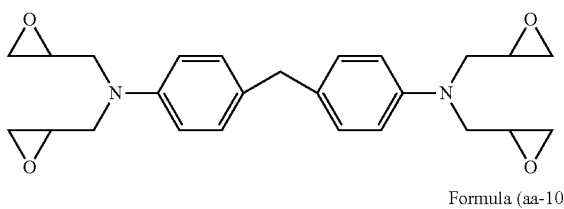

Formula (aa-10)
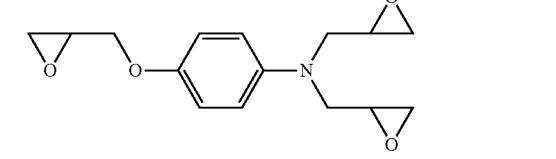

Formula (aa-11)
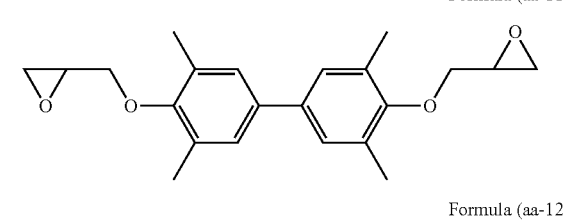

Formula (aa-12)
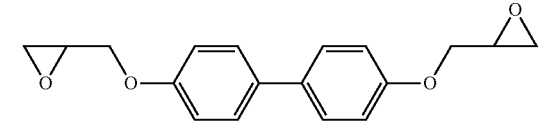

Formula (aa-13)
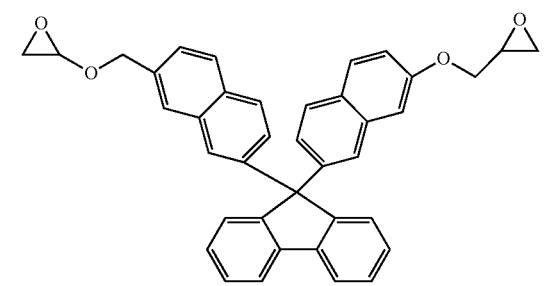

Formula (aa-14)
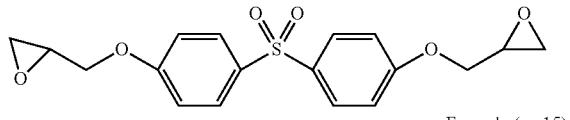

Formula (aa-15)

Formula (aa-16)
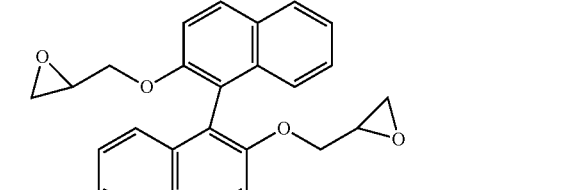

Formula (aa-17)
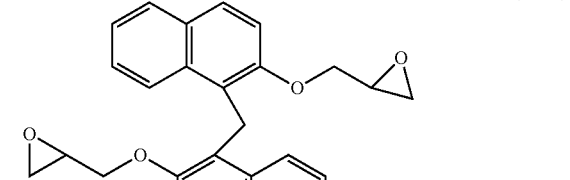

Formula (aa-18)

The monomer compound of Formula (aa-1) can be obtained as trade name HP4700 or HP4710 available from DIC Corporation.

The monomer compound of Formula (aa-2) can be obtained as trade name HP4770 available from DIC Corporation.

The monomer compound of Formula (aa-3) can be obtained as trade name TEP-G available from AOC.

The monomer compound of Formula (aa-4) can be obtained as trade name NC-6000 available from Nippon Kayaku Co., Ltd.

The monomer compound of Formula (aa-5) can be obtained as trade name RE-810NM available from Nippon Kayaku Co., Ltd.

The monomer compound of Formula (aa-6) can be obtained as trade name Liquid Epoxy Bis-A Type available from Mitsubishi Chemical Corporation.

The monomer compound of Formula (aa-7) can be obtained as trade name Liquid Epoxy Bis-F Type available from Mitsubishi Chemical Corporation.

The monomer compound of Formula (aa-8) can be obtained as trade name Polyfunctional Epoxy 1031S available from Mitsubishi Chemical Corporation.

The monomer compound of Formula (aa-9) can be obtained as trade name Polyfunctional Epoxy 604 available from Mitsubishi Chemical Corporation.

The monomer compound of Formula (aa-10) can be obtained as trade name EP-39505/L available from ADEKA CORPORATION.

The monomer compound of Formula (aa-11) can be obtained as trade name YX4000 available from Mitsubishi Chemical Corporation.

The monomer compound of Formula (aa-12) can be obtained as trade name YL6121H available from Mitsubishi Chemical Corporation.

The monomer compound of Formula (aa-13) can be obtained as trade name OGSOL-EG-200 available from Osaka Gas Chemicals Co., Ltd.

The monomer compound of Formula (aa-14) can be obtained as trade name EXA-1514 available from DIC Corporation.

The monomer compound of Formula (aa-15) can be obtained as trade name PG-100 available from Osaka Gas Chemicals Co., Ltd.

The monomer compound of Formula (aa-16) can be obtained as 2,2'-diglycidyloxy-1,1'-binaphthalene.

The monomer compound of Formula (aa-17) can be obtained as trade name HP-4770 available from DIC Corporation.

The monomer compound of Formula (aa-18) can be obtained as trade name YX-8800 available from Mitsubishi Chemical Corporation.

Trade name HP-6000 available from DIC Corporation can also be used.

The aromatic ring-containing monomer usable in the present invention has a molecular weight of 200 to 10,000, or 200 to 2,000, or 200 to 1,000.

The compound (A) usable in the present invention has an epoxy value of 150 to 350 or 150 to 300. An epoxy compound having a softening point of 120° C. or lower can be used.

In the present invention, when the main agent is a mixture of the compound (A) and the compound (B), the ratio by mole of an epoxy group to a vinyl group is 100:1 to 1:100, or 30:1 to 1:30, or 20:1 to 1:1. The compound (B) may have at least one partial structure selected from the group consisting of partial structures of Formulae (B-1) to (B-5), or a partial structure including a combination of a partial structure of Formula (B-6) and a partial structure of Formula (B-7) or (B-8).

In Formulae (B-1) to (B-8), $R^1$, $R^{1a}$, $R^3$, $R^5$, $R^{5a}$, and $R^{6a}$ are each a $C_{1-10}$ saturated hydrocarbon group, a $C_{6-40}$ aromatic hydrocarbon group, an oxygen atom, a carbonyl group, a sulfur atom, a nitrogen atom, an amide group, an amino group, or a group composed of any combination of these; $R^2$, $R^{2a}$, $R^4$, and $R^6$ are each a hydrogen atom, a $C_{1-10}$ saturated hydrocarbon group, a $C_{2-10}$ unsaturated hydrocarbon group, an oxygen atom, a carbonyl group, an amide group, an amino group, or a group composed of any combination of these; $R^2$, $R^{2a}$, $R^4$, and $R^6$ are each a monovalent group; $R^1$, $R^{1a}$, $R^3$, $R^{5a}$, and $R^{6a}$ are each a divalent group; $R^5$ is a trivalent group; n is a repeating unit number of 1 to 10; and a dotted line is a chemical bond to an adjacent atom.

The aforementioned $C_{1-10}$ saturated hydrocarbon group may be a $C_{1-10}$ alkyl group. Examples of the alkyl group include methyl group, ethyl group, n-propyl group, i-propyl group, cyclopropyl group, n-butyl group, i-butyl group, s-butyl group, t-butyl group, cyclobutyl group, 1-methyl-cyclopropyl group, 2-methyl-cyclopropyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, 1-ethyl-2-methyl-n-propyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-i-propyl-cyclopropyl group, 2-i-propyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group, and 2-ethyl-3-methyl-cyclopropyl group.

The aforementioned $C_{1-10}$ saturated hydrocarbon group may be a divalent alkylene group derived from any of the aforementioned alkyl groups.

The aforementioned $C_{2-10}$ unsaturated hydrocarbon group may be, for example, an alkenyl or alkynyl group corresponding to any of the aforementioned alkyl groups having a carbon atom number of 2 or more.

The aforementioned $C_{6-40}$ aromatic hydrocarbon group may be a divalent $C_{6-40}$ arylene group. Examples of the arylene group include phenylene group, biphenylene group, terphenylene group, fluorenylene group, naphthylene group, anthrylene group, pyrenylene group, and carbazolylene group.

Examples of the compound (B) usable in the present invention are as follows.

Formula (b-1)
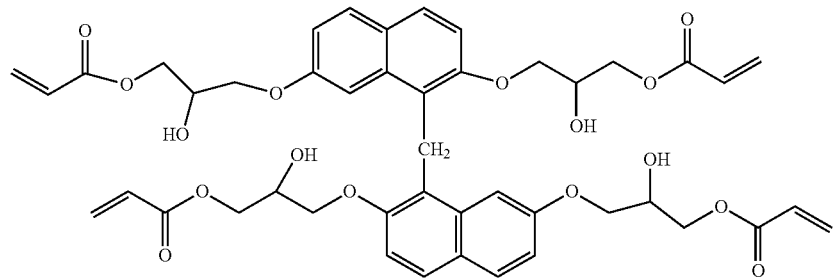
Formula (b-2)
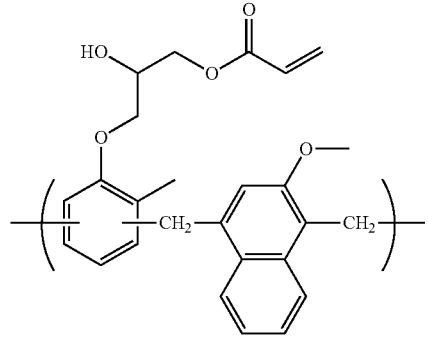
Formula (b-3)
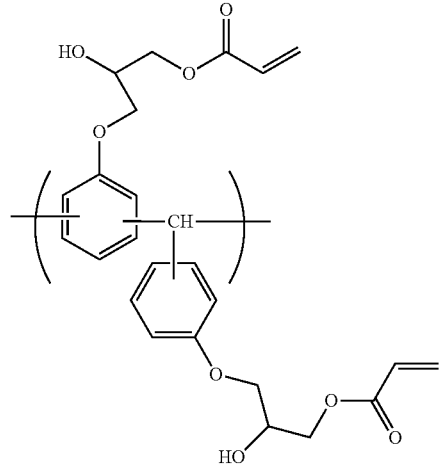
Formula (b-4)
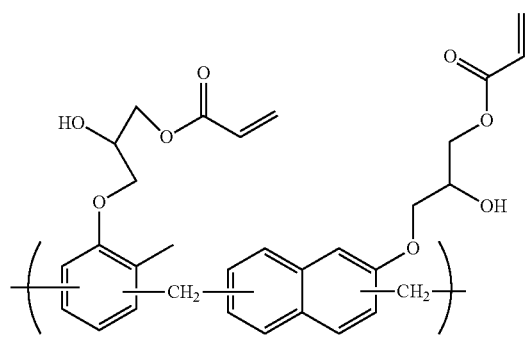
Formula (b-5)
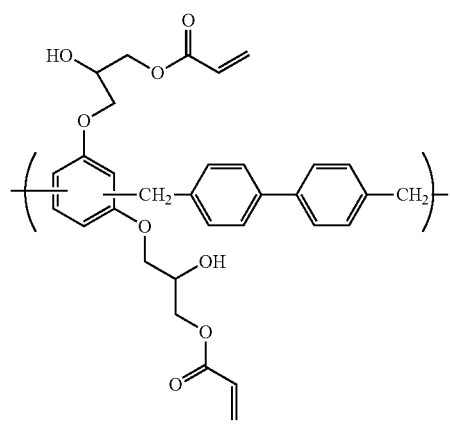
Formula (b-6)
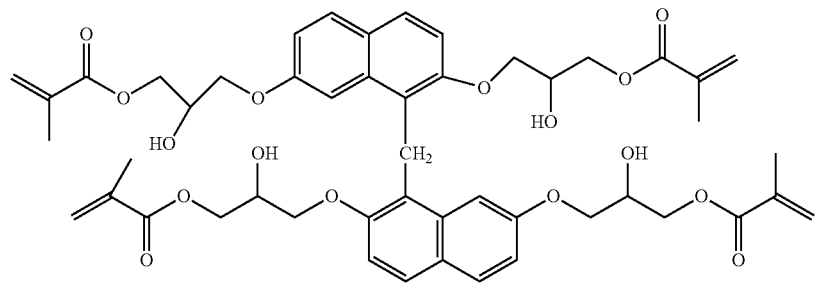

-continued
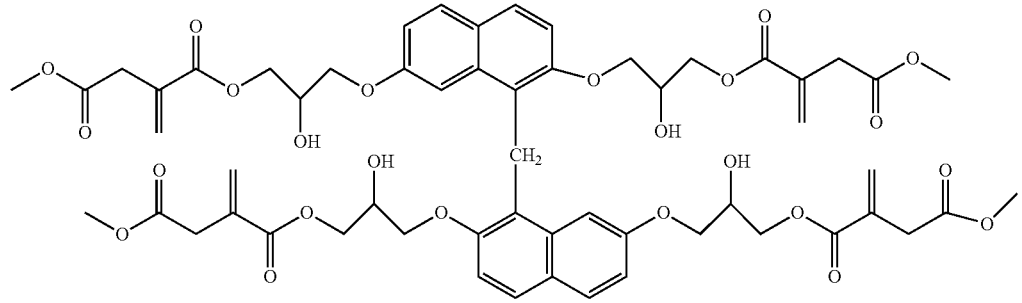
Formula (b-7)
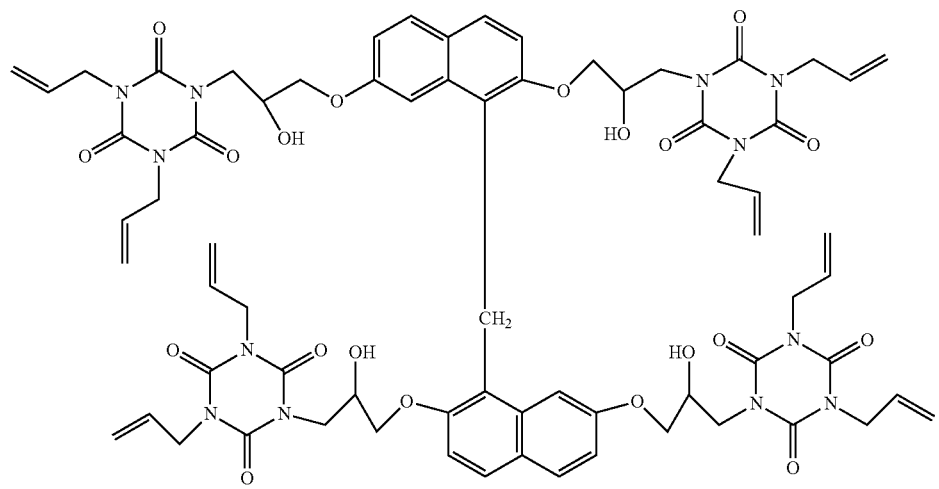
Formula (b-8)
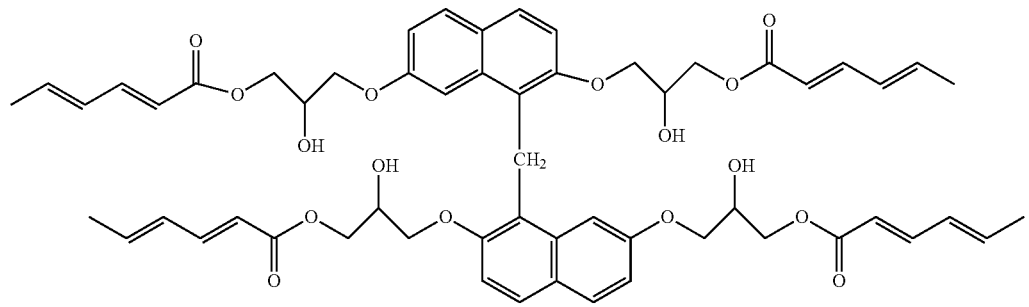
Formula (b-9)
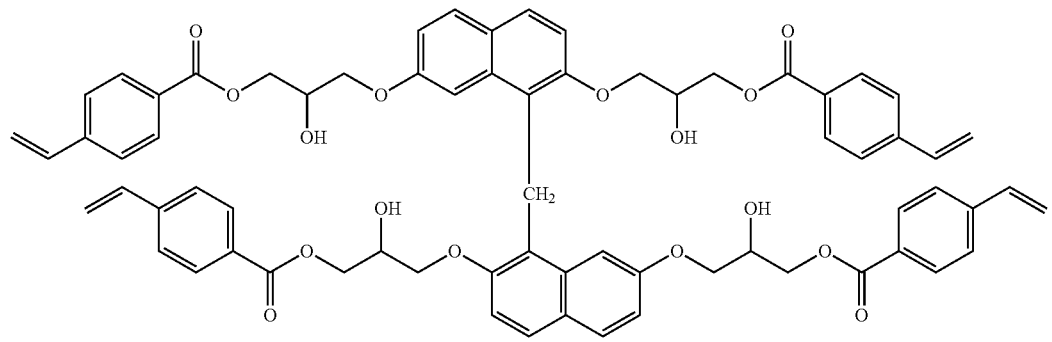
Formula (b-10)

Formula (b-11)
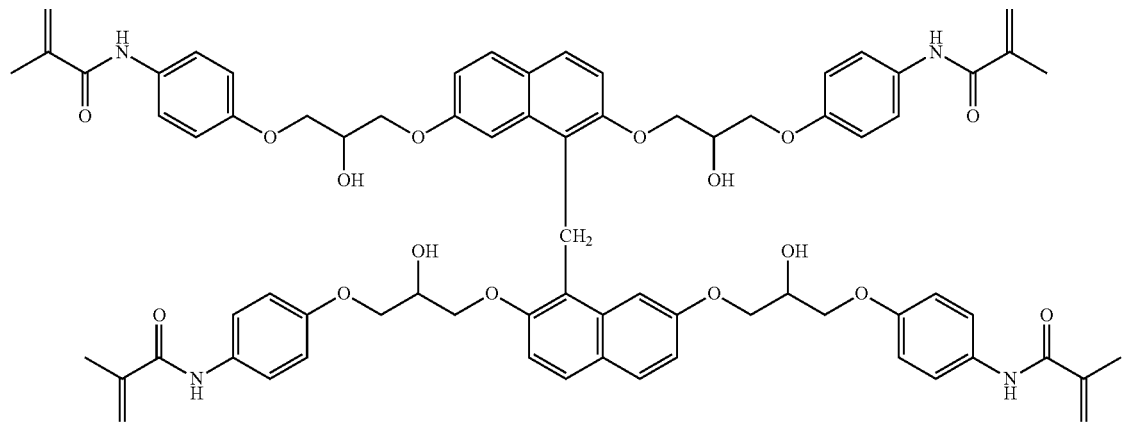
Formula (b-12)
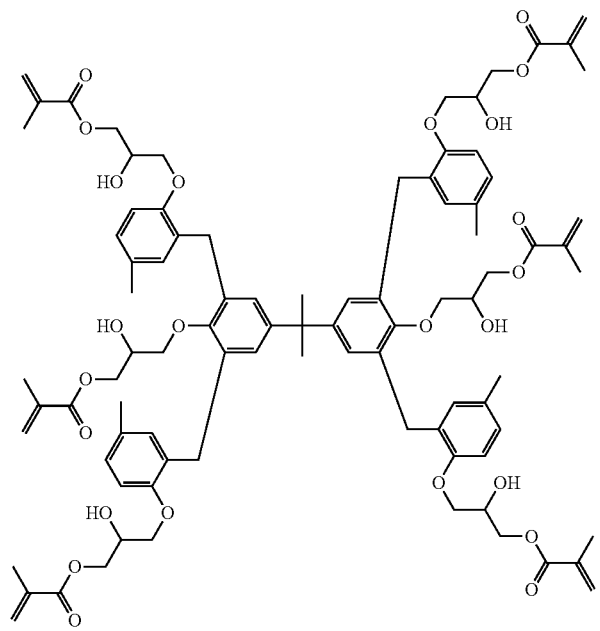
Formula (b-13)
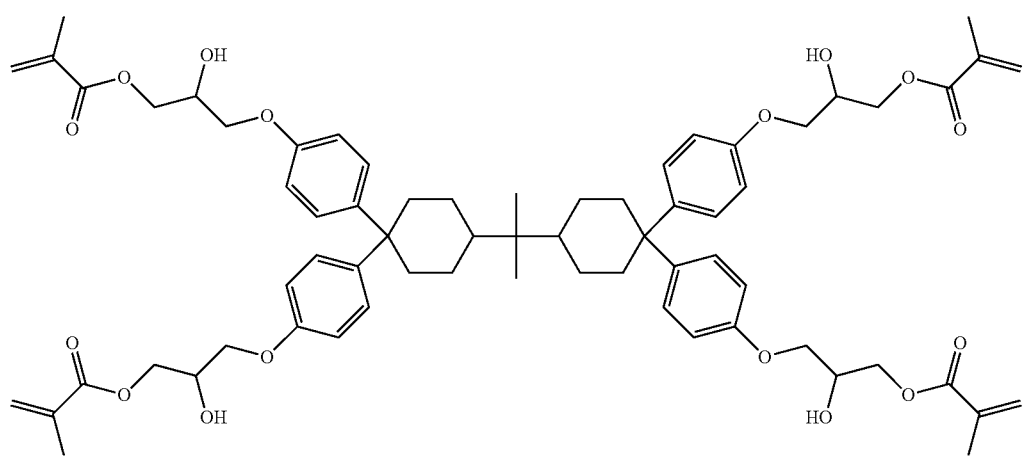

Formula (b-14)
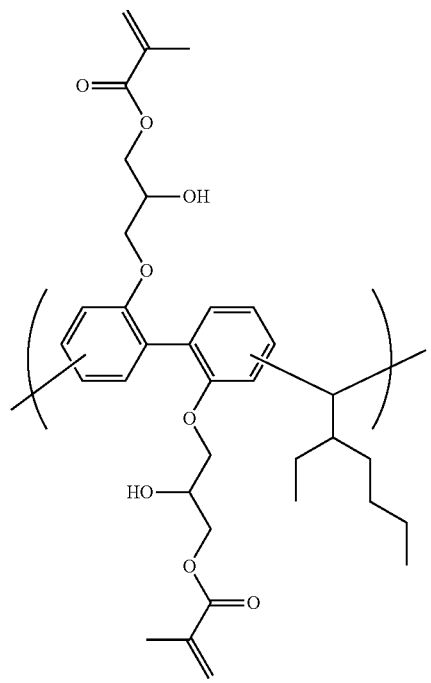
Formula (b-15)
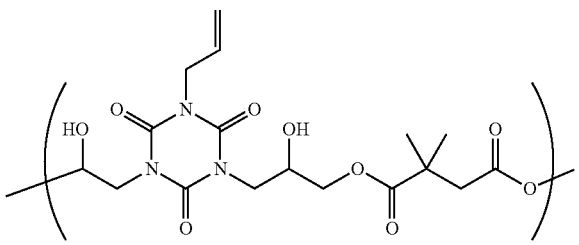
Formula (b-16)
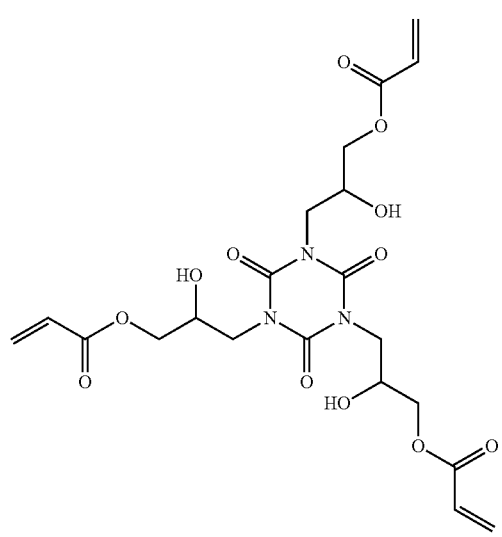
Formula (b-17)
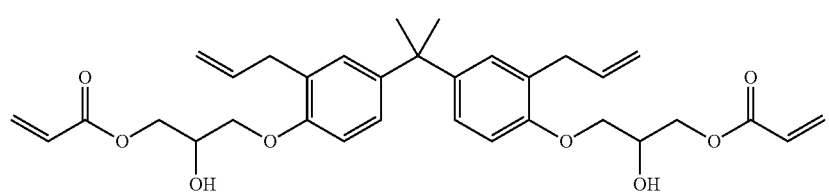

Formula (b-18)
Unit structure (b-18-1) 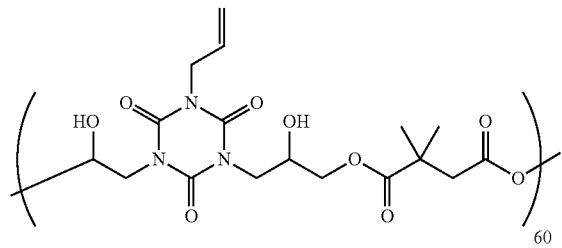
Unit structure (b-18-2) 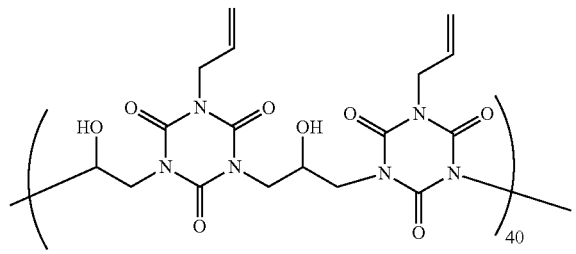
Formula (b-19)
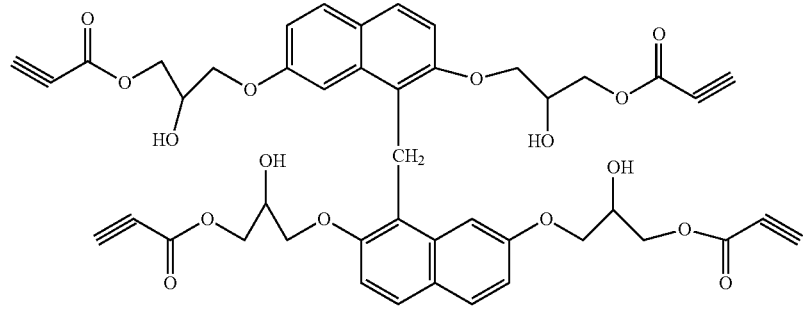
Formula (b-20)
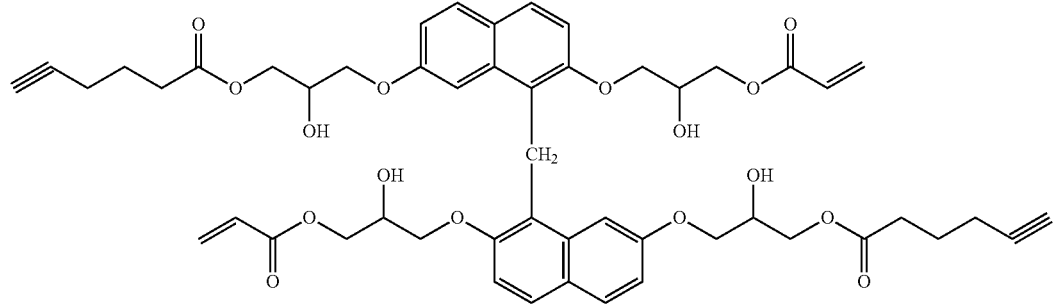
Formula (b-21)
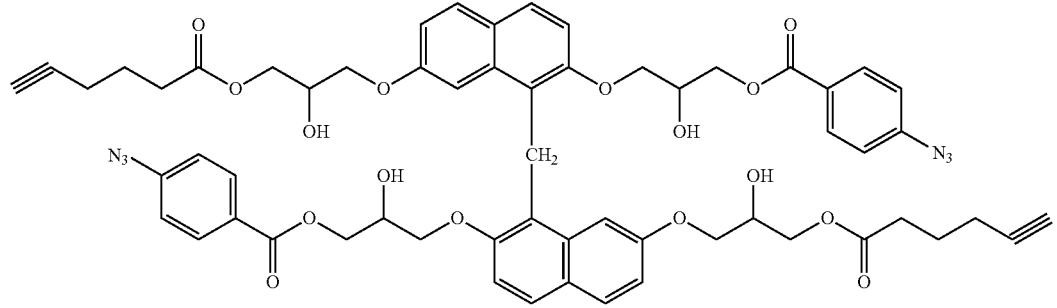
Formula (b-22)
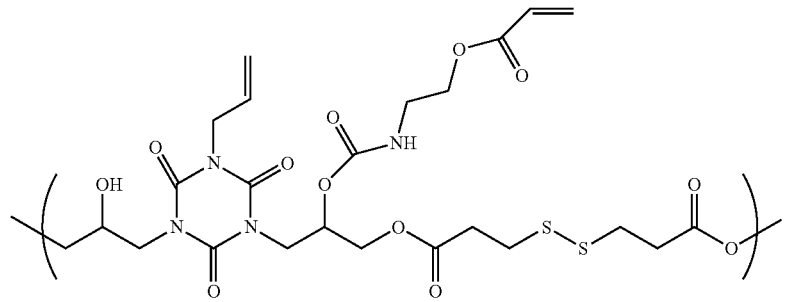

Formula (b-23)

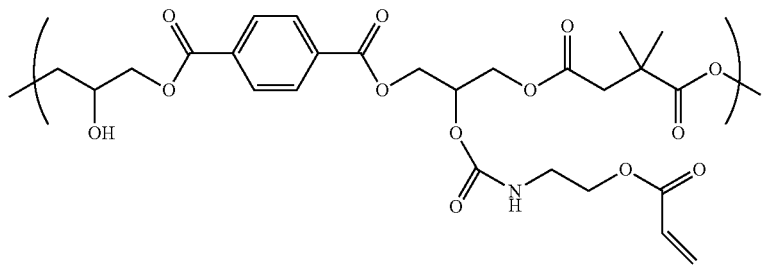

The compound of Formula (b-1) can be prepared by reaction of trade name HP-4700 available from DIC Corporation with acrylic acid.

The compound of Formula (b-2) can be prepared by reaction of trade name HP-5000 available from DIC Corporation with acrylic acid.

The compound of Formula (b-3) can be prepared by reaction of trade name EPPN-501H available from Nippon Kayaku Co., Ltd. with acrylic acid.

The compound of Formula (b-4) can be prepared by reaction of trade name NC-7000L available from Nippon Kayaku Co., Ltd. with acrylic acid.

The compound of Formula (b-5) can be prepared by reaction of trade name NC-3500 available from Nippon Kayaku Co., Ltd. with acrylic acid.

The compound of Formula (b-6) can be prepared by reaction of trade name HP-4700 available from DIC Corporation with methacrylic acid.

The compound of Formula (b-7) is prepared by reaction of trade name HP-4700 available from DIC Corporation with monomethyl itaconate.

The compound of Formula (b-8) can be prepared by reaction of trade name HP-4700 available from DIC Corporation with diallylisocyanuric acid.

The compound of Formula (b-9) can be prepared by reaction of trade name HP-4700 available from DIC Corporation with sorbic acid.

The compound of Formula (b-10) can be prepared by reaction of trade name HP-4700 available from DIC Corporation with 4-vinylbenzoic acid.

The compound of Formula (b-11) can be prepared by reaction of trade name HP-4700 available from DIC Corporation with N-(4-hydroxyphenyl)methacrylamide.

The compound of Formula (b-12) can be prepared by reaction of trade name TEPC-BIP-A available from ASAHI YUKIZAI CORPORATION with glycidyl methacrylate.

The compound of Formula (b-13) is prepared by reaction of trade name TEP-BOCP available from ASAHI YUKIZAI CORPORATION with glycidyl methacrylate.

The compound of Formula (b-14) is prepared by reaction of a reaction product of 2,2'-biphenol and 2-ethylhexylaldehyde with glycidyl methacrylate.

The compound of Formula (b-15) is prepared by reaction of monoallyldiglycidylisocyanuric acid with 2,2-dimethyl succinic acid.

The compound of Formula (b-16) is prepared by reaction of triglycidyl isocyanurate with acrylic acid.

The compound of Formula (b-17) can be prepared by reaction of bisphenol A diallyl with glycidyl acrylate.

The compound of Formula (b-18) is prepared by reaction of monoallyldiglycidylisocyanuric acid with 2,2-dimethyl succinic acid and monoallylisocyanuric acid.

The compound of Formula (b-19) is prepared by reaction of trade name HP-4700 available from DIC Corporation with propargylic acid.

The compound of Formula (b-20) is prepared by reaction of trade name HP-4700 available from DIC Corporation with acrylic acid and 5-hexynoic acid.

The compound of Formula (b-21) is prepared by reaction of trade name HP-4700 available from DIC Corporation with 4-azidobenzoic acid and 5-hexynoic acid.

The compound of Formula (b-22) is prepared by reaction of monoallyldiglycidylisocyanuric acid with 3,3'-dithiopropionic acid and subsequent reaction of the resultant product with 2-isocyanatoethyl acrylate.

The compound of Formula (b-23) is prepared by reaction of diglycidylterephthalic acid with dimethylsuccinic acid and subsequent reaction of the resultant product with 2-isocyanatoethyl acrylate.

The composition of the present invention may contain an acid generator. The acid generator may be a photoacid generator.

Examples of the photoacid generator include onium salt photoacid generators, such as bis(4-t-butylphenyl)iodonium trifluoromethanesulfonate and triphenylsulfonium trifluoromethanesulfonate; halogen-containing compound photoacid generators, such as phenyl-bis(trichloromethyl)-s-triazine; and sulfonic acid photoacid generators, such as benzoin tosylate and N-hydroxysuccinimide trifluoromethanesulfonate. The amount of the photoacid generator is 0.2 to 5% by mass, or 0.4 to 5% by mass, or 0.4 to 4.9% by mass, or 0.4 to 4.8% by mass, relative to the total solid content.

The stepped substrate coating composition of the present invention may contain a surfactant. Examples of the surfactant include nonionic surfactants, for example, polyoxyethylene alkyl ethers, such as polyoxyethylene lauryl ether, polyoxyethylene stearyl ether, polyoxyethylene cetyl ether, and polyoxyethylene oleyl ether, polyoxyethylene alkylaryl ethers, such as polyoxyethylene octylphenyl ether and polyoxyethylene nonylphenyl ether, polyoxyethylene-polyoxypropylene block copolymers, sorbitan fatty acid esters, such as sorbitan monolaurate, sorbitan monopalmitate, sorbitan monostearate, sorbitan monooleate, sorbitan trioleate, and sorbitan tristearate, and polyoxyethylene sorbitan fatty acid esters, such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorine-containing surfactants, such as EFTOP [registered trademark] EF301, EF303, and EF352 (available from Mitsubishi Materials Electronic Chemicals Co., Ltd.), MEGAFAC [registered trademark] F171, F173, R30, R-30N, R-40, and R-40LM (available from DIC Corporation), Fluorad FC430 and FC431 (available from Sumitomo 3M Limited), Asahi Guard [registered trademark] AG710, and SURFLON [registered trademark] S-382, SC101, SC102, SC103, SC104, SC105, and SC106 (available from Asahi Glass Co., Ltd.); and Organosiloxane Polymer KP341 (available from Shin-Etsu Chemical Co., Ltd.). The composition may contain one species selected from these surfactants, or two or more species selected therefrom in combination. The surfactant content is, for example, 0.01% by mass to 5% by mass, or 0.01% by mass to 2% by mass, or 0.01% by mass to 0.2% by mass, or 0.01% by mass to 0.1% by mass, or 0.01% by mass to 0.09% by mass, relative to the solid content of the stepped substrate coating composition of the present invention; i.e., the total amount of all components of the composition, except for the amount of the solvent described below.

Examples of the solvent that can be used for dissolving the compound (A), the compound (B), or the compound (A) and the compound (B) in the present invention include ethylene glycol monomethyl ether, ethylene glycol monoethyl ether, ethylene glycol monobutyl ether, ethylene glycol monoisopropyl ether, ethylene glycol methyl ether acetate, ethylene glycol ethyl ether acetate, methyl cellosolve acetate, ethyl cellosolve acetate, diethylene glycol, diethylene glycol monomethyl ether, diethylene glycol monoethyl ether, diethylene glycol dimethyl ether, diethylene glycol diethyl ether, diethylene glycol monoethyl ether acetate, propylene glycol, propylene glycol monomethyl ether, propylene glycol monobutyl ether, propylene glycol monomethyl ether acetate, propylene glycol monoethyl ether, propylene glycol monoethyl ether acetate, propylene glycol propyl ether acetate, dipropylene glycol monomethyl ether, dipropylene glycol monoethyl ether, triethylene glycol dimethyl ether, toluene, xylene, styrene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, 1-octanol, ethylene glycol, hexylene glycol, trimethylene glycol, 1-methoxy-2-butanol, cyclohexanol, diacetone alcohol, furfuryl alcohol, tetrahydrofurfuryl alcohol, propylene glycol, benzyl alcohol, 1,3-butanediol, 1,4-butanediol, 2,3-butanediol, γ-butyrolactone, acetone, methyl isopropyl ketone, diethyl ketone, methyl isobutyl ketone, methyl normal butyl ketone, isopropyl acetate ketone, normal propyl acetate, isobutyl acetate, methanol, ethanol, isopropanol, tert-butanol, allyl alcohol, normal propanol, 2-methyl-2-butanol, isobutanol, normal butanol, 2-methyl-1-butanol, 1-pentanol, 2-methyl-1-pentanol, 2-ethylhexanol, isopropyl ether, 1,4-dioxane, N,N-dimethyl paternmuamide, N,N-dimethylacetamide, N-methylpyrrolidone, 1,3-dimethyl-2-imidazolidinone, dimethyl sulfoxide, and N-cyclohexyl-2-pyrrolidinone. These organic solvents may be used alone or in combination of two or more species.

Next will be described a method for forming a planarization film from the stepped substrate coating composition of the present invention. Firstly, the stepped substrate coating composition is applied onto a substrate used for the production of a precise integrated circuit element (e.g., a transparent substrate, such as a silicon/silicon dioxide coating, a glass substrate, or an ITO substrate) by an appropriate coating method using, for example, a spinner or a coater. Thereafter, the composition is baked (heated) and then exposed to light, to thereby form a coating film. Specifically, a coated substrate is produced by a method including a step (i) of applying the stepped substrate coating composition to a stepped substrate, and a step (ii) of exposing the composition applied in the step (i) to light or heating the composition at 30° C. to 300° C. or 100° C. to 300° C. during or after light exposure.

When a spinner is used for application of the composition, the application can be performed at a spinner rotation speed of 100 to 5,000 for 10 to 180 seconds.

The aforementioned substrate may have an open area (non-patterned area) and a patterned area of DENSE (dense) and ISO (coarse), and the pattern may have an aspect ratio of 0.1 to 10 or 0.1 to 100.

The "non-patterned area" refers to an area where a pattern (e.g., a hole or a trench structure) is absent on the substrate. "DENSE (dense)" refers to an area where patterns are densely present on the substrate, and "ISO (coarse)" refers to an area where interpattern distance is large and patterns are scattered on the substrate. The aspect ratio of a pattern is the ratio of the depth of the pattern to the width of the pattern. The pattern depth is generally several hundreds of nm (e.g., about 100 to 300 nm). DENSE (dense) is an area where patterns of about several tens of nm (e.g., 30 to 80 nm) are densely present at intervals of about 100 nm. ISO (coarse) is an area where patterns of several hundreds of nm (e.g., about 200 to 1,000 nm) are scattered.

The stepped substrate coating film (planarization film) preferably has a thickness of 0.01 μm to 3.0 μm. After application of the composition, a step (ia) of heating the composition may be performed at 70° C. to 400° C. or at 100° C. to 250° C. for 10 seconds to five minutes or for 30 seconds to two minutes. This heating causes the reflow of the stepped substrate coating composition to thereby form a flat stepped substrate coating film (planarization film).

The exposure light used in the step (ii) is actinic rays, such as near-ultraviolet rays, far-ultraviolet rays, or extreme-ultraviolet rays (e.g., EUV, wavelength: 13.5 nm); for example, light having a wavelength of 248 nm (KrF laser beam), 193 nm (ArF laser beam), 172 nm (xenon excimer light), or 157 nm ($F_2$ laser beam). The light exposure can be performed with ultraviolet light having a wavelength of 150 nm to 248 nm, preferably a wavelength of 172 nm.

The light exposure is performed for crosslinking of the stepped substrate coating film (planarization film). In the step (ii), the dose of the exposure light may be 10 mJ/cm$^2$ to 3,000 mJ/cm$^2$ or 10 mJ/cm$^2$ to 5,000 mJ/cm$^2$. Photoreaction occurs at an exposure dose within such a range, leading to formation of a crosslink, resulting in achievement of solvent resistance.

In the thus-formed stepped substrate coating film (planarization film), the Bias (difference in coating level) is preferably zero between the open area and the patterned area. The planarization can be performed so that the Bias falls within a range of 1 nm to 50 nm or 1 nm to 25 nm. The Bias between the open area and the DENSE area is about 15 nm to 20 nm, and the Bias between the open area and the ISO area is about 1 nm to 10 nm.

The stepped substrate coating film (planarization film) produced by the method of the present invention can be coated with a resist film, and the resist film can be exposed to light and developed by a lithography process, to thereby form a resist pattern. The substrate can be processed with the resist pattern. In this case, the stepped substrate coating film (planarization film) is a resist underlayer film, and the stepped substrate coating composition is a resist underlayer film-forming composition.

A resist can be applied onto the resist underlayer film, and the resist can be irradiated with light or electron beams through a predetermined mask, followed by development, rinsing, and drying, to thereby form a good resist pattern. Post exposure bake (PEB) may optionally be performed after the irradiation with light or electron beams. The resist underlayer film at a portion where the resist film has been developed and removed in the aforementioned step can be removed by dry etching, to thereby form a desired pattern on the substrate.

The resist used in the present invention is a photoresist or an electron beam resist.

In the present invention, the photoresist applied onto the resist underlayer film for lithography may be either of negative and positive photoresists. Examples of the photoresist include a positive photoresist formed of a novolac resin and a 1,2-naphthoquinone diazide sulfonic acid ester; a chemically amplified photoresist formed of a binder having a group that decomposes with an acid to thereby increase an alkali dissolution rate and a photoacid generator; a chemically amplified photoresist formed of an alkali-soluble binder, a low-molecular-weight compound that decomposes with an acid to thereby increase the alkali dissolution rate of the photoresist, and a photoacid generator; a chemically amplified photoresist formed of a binder having a group that decomposes with an acid to thereby increase an alkali dissolution rate, a low-molecular-weight compound that decomposes with an acid to thereby increase the alkali dissolution rate of the photoresist, and a photoacid generator; and a photoresist having an Si atom-containing skeleton. Specific examples of the photoresist include trade name APEX-E available from Rohm and Haas Company.

In the present invention, the electron beam resist applied onto the resist underlayer film for lithography is, for example, a composition containing a resin having an Si—Si bond in a main chain and an aromatic ring at a terminal, and an acid generator that generates an acid through irradiation with electron beams; or a composition containing poly(p-hydroxystyrene) wherein a hydroxyl group is substituted with an N-carboxyamine-containing organic group, and an acid generator that generates an acid through irradiation with electron beams. In the latter electron beam resist composition, an acid generated from the acid generator through irradiation with electron beams reacts with an N-carboxyaminoxy group at a side chain of the polymer, and the polymer side chain decomposes into a hydroxyl group, exhibits alkali solubility, and dissolves in an alkaline developer, to thereby form a resist pattern. Examples of the acid generator that generates an acid through irradiation with electron beams include halogenated organic compounds, such as 1,1-bis[p-chlorophenyl]-2,2,2-trichloroethane, 1,1-bis[p-methoxyphenyl]-2,2,2-trichloroethane, 1,1-bis[p-chlorophenyl]-2,2-dichloroethane, and 2-chloro-6-(trichloromethyl)pyridine; onium salts, such as triphenylsulfonium salts and diphenyliodonium salts; and sulfonic acid esters, such as nitrobenzyl tosylate and dinitrobenzyl tosylate.

The exposure light used for the aforementioned photoresist is actinic rays, such as near-ultraviolet rays, far-ultraviolet rays, or extreme-ultraviolet rays (e.g., EUV, wavelength: 13.5 nm); for example, light having a wavelength of 248 nm (KrF laser beam), 193 nm (ArF laser beam), or 172 nm. No particular limitation is imposed on the usable photoirradiation method, so long as the method can generate an acid from a photoacid generator contained in the resist film. The dose of the exposure light is 1 to 5,000 mJ/cm$^2$, or 10 to 5,000 mJ/cm$^2$, or 10 to 1,000 mJ/cm$^2$.

The electron beam resist can be irradiated with electron beams by using, for example, an electron beam irradiation apparatus.

Examples of the developer for the resist film having the resist underlayer film formed from the resist underlayer film-forming composition for lithography of the present invention include aqueous solutions of alkalis, for example, inorganic alkalis, such as sodium hydroxide, potassium hydroxide, sodium carbonate, sodium silicate, sodium metasilicate, and aqueous ammonia, primary amines, such as ethylamine and n-propylamine, secondary amines, such as diethylamine and di-n-butylamine, tertiary amines, such as triethylamine and methyldiethylamine, alcoholamines, such as dimethylethanolamine and triethanolamine, quaternary ammonium salts, such as tetramethylammonium hydroxide, tetraethylammonium hydroxide, and choline, and cyclic amines, such as pyrrole and piperidine. The developer to be used may be prepared by addition of an appropriate amount of an alcohol (e.g., isopropyl alcohol) or a surfactant (e.g., a nonionic surfactant) to any of the aforementioned aqueous alkali solutions. Among these developers, quaternary ammonium salts are preferred, and tetramethylammonium hydroxide and choline are more preferred.

The developer may be an organic solvent. Examples of the organic solvent include methyl acetate, butyl acetate, ethyl acetate, isopropyl acetate, amyl acetate, isoamyl acetate, ethyl methoxyacetate, ethyl ethoxyacetate, propylene glycol monomethyl ether, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3-ethoxypropionate, and propyl-3-methoxypropionate. Such a developer may further contain, for example, a surfactant. The development is performed under appropriately determined conditions; i.e., a temperature of 5 to 50° C. and a time of 10 to 600 seconds.

In the present invention, a semiconductor device can be produced through a step of forming a resist underlayer film on a semiconductor substrate from the resist underlayer film-forming composition; a step of forming a resist film on the resist underlayer film; a step of irradiating the resist film with light or electron beams, and developing the resist film, to thereby form a resist pattern; a step of etching the resist underlayer film with the resist pattern; and a step of processing the semiconductor substrate with the patterned resist underlayer film.

In the future, the formation of a finer resist pattern will cause a problem in terms of resolution and a problem in that the resist pattern collapses after development, and a decrease in the thickness of a resist will be demanded. Thus, it is difficult to form a resist pattern having a thickness sufficient for processing of a substrate. This requires a process for imparting a mask function, during the substrate processing, not only to the resist pattern, but also to a resist underlayer film that is formed between the resist film and the semiconductor substrate to be processed. The resist underlayer film required for such a process is not a conventional resist underlayer film having a high etching rate, but a resist underlayer film for lithography having a selection ratio of dry etching rate similar to that of the resist film, a resist underlayer film for lithography having a smaller selection ratio of dry etching rate than the resist film, or a resist underlayer film for lithography having a smaller selection ratio of dry etching rate than the semiconductor substrate. Such a resist underlayer film may be provided with an anti-reflective performance; i.e., the film may also have the function of a conventional anti-reflective coating.

Meanwhile, a finer resist pattern has started to be formed by using a process for making a resist pattern and a resist underlayer film thinner than the pattern width during the resist development by dry etching of the resist underlayer film. The resist underlayer film required for such a process is not a conventional anti-reflective coating having a high etching rate, but a resist underlayer film having a selection ratio of dry etching rate similar to that of the resist film. Such a resist underlayer film may be provided with an anti-reflective performance; i.e., the film may also have the function of a conventional anti-reflective coating.

In the present invention, after formation of the resist underlayer film of the present invention on a substrate, a resist may be applied directly to the resist underlayer film, or if necessary, the resist may be applied after formation of one to several layers of coating material on the resist underlayer film. This process reduces the pattern width of the resist film. Thus, even when the resist film is thinly applied for prevention of pattern collapse, the substrate can be processed with an appropriately selected etching gas.

Specifically, a semiconductor device can be produced through a step of forming a resist underlayer film on a semiconductor substrate from the resist underlayer film-forming composition; a step of forming, on the resist underlayer film, a hard mask from a coating material containing, for example, a silicon component or a hard mask (e.g., from silicon nitride oxide) by vapor deposition; a step of forming a resist film on the hard mask; a step of forming a resist pattern by irradiation with light or electron beams and development; a step of etching the hard mask with the resist pattern by using a halogen-containing gas; a step of etching the resist underlayer film with the patterned hard mask by using an oxygen-containing gas or a hydrogen-containing gas; and a step of processing the semiconductor substrate with the patterned resist underlayer film by using a halogen-containing gas.

In consideration of the effect of the resist underlayer film for lithography of the present invention as an anti-reflective coating, since the light-absorbing moiety is incorporated into the skeleton of the film, the film does not diffuse any substance in the photoresist during heating and drying. The resist underlayer film exhibits high anti-reflective effect, since the light-absorbing moiety has sufficiently high light absorption performance.

The resist underlayer film-forming composition for lithography of the present invention has high thermal stability, and thus can prevent pollution of an upper-layer film caused by a decomposed substance during baking. Also, the composition can provide a temperature margin in a baking step.

Depending on process conditions, the resist underlayer film for lithography of the present invention can be used as a film having the function of preventing light reflection and the function of preventing the interaction between the substrate and the photoresist or preventing the adverse effect, on the substrate, of a material used for the photoresist or a substance generated during the exposure of the photoresist to light.

EXAMPLES

Synthesis Example 1

A two-necked flask was charged with 6.84 g of diphenylamine (available from Kanto Chemical Co., Inc.), 7.49 g of 3-hydroxydiphenylamine (available from Tokyo Chemical Industry Co., Ltd.), 10.36 g of ethylhexylaldehyde (available from Tokyo Chemical Industry Co., Ltd.), 25.0 g of propylene glycol monomethyl ether acetate, and 0.31 g of methanesulfonic acid (available from Tokyo Chemical Industry Co., Ltd.). Thereafter, the mixture was heated to 120° C. and refluxed with stirring for about five hours. After completion of the reaction, the mixture was diluted with 20 g of tetrahydrofuran (available from Kanto Chemical Co., Inc.), and the polymer solution was added dropwise to a solvent mixture of methanol (available from Kanto Chemical Co., Inc.), ultrapure water, and 30% aqueous ammonia (available from Kanto Chemical Co., Inc.) for reprecipitation. The resultant precipitate was subjected to suction filtration, and the filtrate was dried under reduced pressure at 60° C. overnight, to thereby prepare 23.8 g of compound 13 resin. The resultant polymer corresponds to the following Formula (C-1). The compound was found to have a weight average molecular weight Mw of 10,200 as determined by GPC in terms of polystyrene.

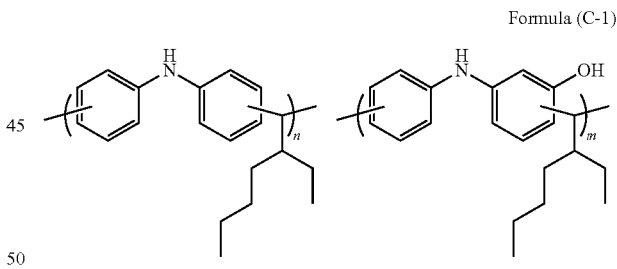

Formula (C-1)

Synthesis Example 2

Firstly, 34.91 g of propylene glycol monomethyl ether was added to 10.00 g of an epoxy group-containing benzene condensed ring compound (trade name: EPICLON HP-4700, epoxy value: 165 g/eq., available from DIC Corporation, Formula (aa-1)), 4.37 g of acrylic acid, 0.56 g of ethyltriphenylphosphonium bromide, and 0.03 g of hydroquinone, and the mixture was stirred in a nitrogen atmosphere under heating at 100° C. for 21 hours. To the resultant solution were added 15 g of a cation-exchange resin (trade name: DOWEX [registered trademark] 550A, available from MUROMACHI TECHNOS CO., LTD.) and 15 g of an anion-exchange resin (trade name: Amberlite [registered trademark] 15JWET, available from ORGANO CORPORA- TION), and the mixture was subjected to ion-exchange treatment at room temperature for four hours. The ion-exchange resins were then separated to thereby prepare a solution of compound (E). The resultant compound (B) corresponds to Formula (b-1). The compound was found to have a weight average molecular weight Mw of 1,400 as determined by GPC in terms of polystyrene.

Synthesis Example 3

Firstly, 43.89 g of propylene glycol monomethyl ether was added to 14.00 g of an epoxy group-containing benzene condensed ring compound (trade name: EPICLON HP-6000, epoxy value: 239 g/eq., available from DIC Corporation), 4.24 g of acrylic acid, 0.54 g of ethyltriphenylphosphonium bromide, and 0.03 g of hydroquinone, and the mixture was stirred in a nitrogen atmosphere under heating at 100° C. for 22 hours. To the resultant solution were added 19 g of a cation-exchange resin (trade name: DOWEX [registered trademark] 550A, available from MUROMACHI TECHNOS CO., LTD.) and 19 g of an anion-exchange resin (trade name: Amberlite [registered trademark] 15JWET, available from ORGANO CORPORATION), and the mixture was subjected to ion-exchange treatment at room temperature for four hours. The ion-exchange resins were then separated to thereby prepare a solution corresponding to compound (B). The resultant compound was found to have a weight average molecular weight Mw of 800 as determined by GPC in terms of polystyrene.

Synthesis Example 4

Firstly, 45.22 g of propylene glycol monomethyl ether was added to 9.00 g of an epoxy group-containing benzene condensed ring compound (trade name: EPICLON HP-4700, epoxy value: 162 g/eq., available from DIC Corporation, Formula (aa-1)), 9.84 g of N-(4-hydroxyphenyl)methacrylamide, 1.04 g of ethyltriphenylphosphonium bromide, and 0.02 g of hydroquinone, and the mixture was stirred in a nitrogen atmosphere under heating at 100° C. for 25 hours. To the resultant solution were added 20 g of a cation-exchange resin (trade name: DOWEX [registered trademark] 550A, available from MUROMACHI TECHNOS CO., LTD.) and 20 g of an anion-exchange resin (trade name: Amberlite [registered trademark] 15JWET, available from ORGANO CORPORATION), and the mixture was subjected to ion-exchange treatment at room temperature for four hours. The ion-exchange resins were then separated to thereby prepare a solution of compound (A). The resultant compound (B) corresponds to Formula (b-11). The compound was found to have a weight average molecular weight Mw of 1,900 as determined by GPC in terms of polystyrene. No remaining epoxy group was observed.

Synthesis Example 5

Firstly, 44.77 g of propylene glycol monomethyl ether was added to 14.00 g of an epoxy group-containing benzene condensed ring compound (trade name: RE-810NM, epoxy value: 221 g/eq., available from Nippon Kayaku Co., Ltd., Formula (aa-5)), 4.56 g of acrylic acid, 0.59 g of ethyltriphenylphosphonium bromide, and 0.03 g of hydroquinone, and the mixture was stirred in a nitrogen atmosphere under heating at 100° C. for 22 hours. To the resultant solution were added 19 g of a cation-exchange resin (trade name: DOWEX [registered trademark] 550A, available from MUROMACHI TECHNOS CO., LTD.) and 19 g of an anion-exchange resin (trade name: Amberlite [registered trademark] 15JWET, available from ORGANO CORPORATION), and the mixture was subjected to ion-exchange treatment at room temperature for four hours. The ion-exchange resins were then separated to thereby prepare a solution of compound (B). The resultant compound (B) corresponds to Formula (b-17). The compound was found to have a weight average molecular weight Mw of 900 as determined by GPC in terms of polystyrene. No remaining epoxy group was observed.

Example 1

Firstly, 2 g of trade name EPPN-201 (available from Nippon Kayaku Co., Ltd., Formula (a-6)) was dissolved in 18 g of cyclohexanone. Thereafter, the solution was filtered with a polytetrafluoroethylene-made micro filter (pore size: 0.1 µm) to thereby prepare a solution of a resist underlayer film-forming composition.

Example 2

Firstly, 2 g of trade name EPPN-501H (available from Nippon Kayaku Co., Ltd., Formula (a-9)) was dissolved in 18 g of propylene glycol monomethyl ether acetate. Thereafter, the solution was filtered with a polytetrafluoroethylene-made micro filter (pore size: 0.1 µm) to thereby prepare a solution of a resist underlayer film-forming composition.

Example 3

Firstly, 2 g of trade name 1032H60 (available from Mitsubishi Chemical Corporation, Formula (a-12)) was dissolved in 18 g of propylene glycol monomethyl ether acetate. Thereafter, the solution was filtered with a polytetrafluoroethylene-made micro filter (pore size: 0.1 µm) to thereby prepare a solution of a resist underlayer film-forming composition.

Example 4

Firstly, 2 g of trade name 157S70 (available from Mitsubishi Chemical Corporation, Formula (a-11)) was dissolved in 18 g of propylene glycol monomethyl ether acetate. Thereafter, the solution was filtered with a polytetrafluoroethylene-made micro filter (pore size: 0.1 µm) to thereby prepare a solution of a resist underlayer film-forming composition.

Example 5

Firstly, 2 g of trade name HP-4700 (available from DIC Corporation, Formula (aa-1)) was dissolved in 18 g of propylene glycol monomethyl ether acetate. Thereafter, the solution was filtered with a polytetrafluoroethylene-made micro filter (pore size: 0.1 µm) to thereby prepare a solution of a resist underlayer film-forming composition.

Example 6

Firstly, 2 g of trade name HP-7200HHH (available from DIC Corporation, Formula (a-2)) was dissolved in 18 g of propylene glycol monomethyl ether acetate. Thereafter, the solution was filtered with a polytetrafluoroethylene-made

Example 7

Firstly, 2 g of trade name NC-3000-L (available from Nippon Kayaku Co., Ltd., Formula (a-4)) was dissolved in 18 g of propylene glycol monomethyl ether acetate. Thereafter, the solution was filtered with a polytetrafluoroethylene-made micro filter (pore size: 0.1 μm) to thereby prepare a solution of a resist underlayer film-forming composition.

Example 8

Firstly, 2 g of trade name NC3500 (available from Nippon Kayaku Co., Ltd., Formula (a-8)) was dissolved in 18 g of propylene glycol monomethyl ether acetate. Thereafter, the solution was filtered with a polytetrafluoroethylene-made micro filter (pore size: 0.1 μm) to thereby prepare a solution of a resist underlayer film-forming composition.

Example 9

Firstly, 2 g of trade name NC-6000 (available from Nippon Kayaku Co., Ltd., Formula (aa-4)) was dissolved in 18 g of propylene glycol monomethyl ether acetate. Thereafter, the solution was filtered with a polytetrafluoroethylene-made micro filter (pore size: 0.1 μm) to thereby prepare a solution of a resist underlayer film-forming composition.

Example 10

Firstly, 2 g of trade name NC-7300L (available from Nippon Kayaku Co., Ltd., Formula (a-7)) was dissolved in 18 g of propylene glycol monomethyl ether acetate. Thereafter, the solution was filtered with a polytetrafluoroethylene-made micro filter (pore size: 0.1 μm) to thereby prepare a solution of a resist underlayer film-forming composition.

Example 11

Firstly, 2 g of trade name 1031S (available from Mitsubishi Chemical Corporation, Formula (aa-8)) was dissolved in 18 g of propylene glycol monomethyl ether acetate. Thereafter, the solution was filtered with a polytetrafluoroethylene-made micro filter (pore size: 0.1 μm) to thereby prepare a solution of a resist underlayer film-forming composition.

Example 12

Firstly, 2 g of trade name NC-7000L (available from Nippon Kayaku Co., Ltd., Formula (a-5)) was dissolved in 18 g of propylene glycol monomethyl ether acetate. Thereafter, the solution was filtered with a polytetrafluoroethylene-made micro filter (pore size: 0.1 μm) to thereby prepare a solution of a resist underlayer film-forming composition.

Example 13

Firstly, 3.72 g of propylene glycol monomethyl ether acetate containing 22.82% by mass trade name HP-4700 (available from DIC Corporation, Formula (aa-1)) was mixed with 2.14 g of propylene glycol monomethyl ether containing 2% by mass TPS-TF (photoacid generator, available from Toyo Gosei Co., Ltd.), 0.08 g of a propylene glycol monomethyl ether acetate solution containing 1% by weight a surfactant (product name: MEGAFAC [trade name] R-40, fluorine-containing surfactant, available from DIC Corporation), 3.38 g of propylene glycol monomethyl ether acetate, and 0.63 g of propylene glycol monomethyl ether. Thereafter, the mixture was filtered with a polytetrafluoroethylene-made micro filter (pore size: 0.1 μm) to thereby prepare a solution of a resist underlayer film-forming composition.

Example 14

Firstly, 3.81 g of propylene glycol monomethyl ether acetate containing 22.45% by mass trade name NC-7300-L (available from Nippon Kayaku Co., Ltd., Formula (a-7)) was mixed with 2.14 g of propylene glycol monomethyl ether containing 2% by mass TPS-TF (photoacid generator, available from Toyo Gosei Co., Ltd.), 0.08 g of a propylene glycol monomethyl ether acetate solution containing 1% by weight a surfactant (product name: MEGAFAC [trade name] R-40, fluorine-containing surfactant, available from DIC Corporation), 3.33 g of propylene glycol monomethyl ether acetate, and 0.63 g of propylene glycol monomethyl ether. Thereafter, the mixture was filtered with a polytetrafluoroethylene-made micro filter (pore size: 0.1 μm) to thereby prepare a solution of a resist underlayer film-forming composition.

Example 15

Firstly, 0.59 g of propylene glycol monomethyl ether acetate containing 29.78% by mass trade name 1031S (available from Mitsubishi Chemical Corporation, Formula (aa-8)) was mixed with 2.10 g of the resin solution prepared in Synthesis Example 2 (solid content: 25.02% by mass), 0.03 g of a propylene glycol monomethyl ether acetate solution containing 1% by weight a surfactant (product name: MEGAFAC [trade name] R-40, fluorine-containing surfactant, available from DIC Corporation), 3.96 g of propylene glycol monomethyl ether acetate, and 0.32 g of propylene glycol monomethyl ether. Thereafter, the mixture was filtered with a polytetrafluoroethylene-made micro filter (pore size: 0.1 μm) to thereby prepare a solution of a resist underlayer film-forming composition.

Example 16

Firstly, 1.17 g of propylene glycol monomethyl ether acetate containing 29.78% by mass trade name 1031S (available from Mitsubishi Chemical Corporation, Formula (aa-8)) was mixed with 1.40 g of the resin solution prepared in Synthesis Example 2 (solid content: 25.02% by mass), 0.07 g of a propylene glycol monomethyl ether acetate solution containing 1% by weight a surfactant (product name: MEGAFAC [trade name] R-40, fluorine-containing surfactant, available from DIC Corporation), 3.52 g of propylene glycol monomethyl ether acetate, and 0.84 g of propylene glycol monomethyl ether. Thereafter, the mixture was filtered with a polytetrafluoroethylene-made micro filter (pore size: 0.1 μm) to thereby prepare a solution of a resist underlayer film-forming composition.

Example 17

Firstly, 2.34 g of propylene glycol monomethyl ether acetate containing 29.83% by mass trade name 157S70 (available from Mitsubishi Chemical Corporation, Formula (a-11)) was mixed with 0.93 g of the resin solution prepared in Synthesis Example 2 (solid content: 25.02% by mass), 0.14 g of a propylene glycol monomethyl ether acetate solution containing 1% by weight a surfactant (product name: MEGAFAC [trade name] R-40, fluorine-containing surfactant, available from DIC Corporation), 2.63 g of propylene glycol monomethyl ether acetate, and 1.19 g of propylene glycol monomethyl ether. Thereafter, the mixture was filtered with a polytetrafluoroethylene-made micro filter (pore size: 0.1 μm) to thereby prepare a solution of a resist underlayer film-forming composition.

Example 18

Firstly, 2.35 g of propylene glycol monomethyl ether acetate containing 29.78% by mass trade name 1031S (available from Mitsubishi Chemical Corporation, Formula (aa-8)) was mixed with 0.93 g of the resin solution prepared in Synthesis Example 2 (solid content: 25.02% by mass), 0.14 g of a propylene glycol monomethyl ether acetate solution containing 1% by weight a surfactant (product name: MEGAFAC [trade name] R-40, fluorine-containing surfactant, available from DIC Corporation), 2.62 g of propylene glycol monomethyl ether acetate, and 1.20 g of propylene glycol monomethyl ether. Thereafter, the mixture was filtered with a polytetrafluoroethylene-made micro filter (pore size: 0.1 μm) to thereby prepare a solution of a resist underlayer film-forming composition.

Example 19

To 2.94 g of the resin solution prepared in Synthesis Example 4 (Formula (b-11), solid content: 23.75% by mass) and 3.07 g of the resin solution prepared in Synthesis Example 5 (Formula (b-17), solid content: 22.81% by mass) were added 0.001 g of a surfactant (product name: MEGAFAC [trade name] R-40, fluorine-containing surfactant, available from DIC Corporation), 8.41 g of propylene glycol monomethyl ether, and 5.58 g of propylene glycol monomethyl ether acetate, to thereby prepare a solution of an organic underlayer film-forming composition for coating of a stepped substrate.

Comparative Example 1

The resin prepared in Synthesis Example 1 was dissolved in propylene glycol monomethyl ether acetate, and the solution was subjected to ion-exchange treatment, to thereby prepare a resin solution (solid content: 30.1% by mass). To 1.41 g of the resin solution were added 0.04 g of propylene glycol monomethyl ether acetate containing 1% by mass a surfactant (MEGAFAC R-40, available from DIC Corporation), 0.13 g of PL-L1 (available from Midori Kagaku Co., Ltd.), 0.32 g of propylene glycol monomethyl ether containing 2% by mass pyridinium p-hydroxybenzenesulfonate, 3.48 g of propylene glycol monomethyl ether acetate, and 1.62 g of propylene glycol monomethyl ether. The mixture was filtered with a polytetrafluoroethylene-made micro filter (pore size: 0.1 μm) to thereby prepare a solution of a resist underlayer film-forming composition.

Comparative Example 2

To 4.19 g of the resin solution prepared in Synthesis Example 2 (solid content: 25.02% by mass) were added 0.001 g of a surfactant (product name: MEGAFAC [trade name] R-40, fluorine-containing surfactant, available from DIC Corporation), 6.62 g of propylene glycol monomethyl ether, and 4.19 g of propylene glycol monomethyl ether acetate. The mixture was filtered with a polytetrafluoroethylene-made micro filter (pore size: 0.1 μm) to thereby prepare a solution of a resist underlayer film-forming composition.

Comparative Example 3

To 8.13 g of the resin solution prepared in Synthesis Example 3 (solid content: 25.80% by mass) were added 0.002 g of a surfactant (product name: MEGAFAC [trade name] R-40, fluorine-containing surfactant, available from DIC Corporation), 13.50 g of propylene glycol monomethyl ether, and 8.37 g of propylene glycol monomethyl ether acetate. The mixture was filtered with a polytetrafluoroethylene-made micro filter (pore size: 0.1 μm) to thereby prepare a solution of a resist underlayer film-forming composition.

(Solvent Resistance Test)

Each of the resist underlayer film-forming compositions prepared in Comparative Examples 2 and 3 and Examples 1 to 19 was applied onto a silicon wafer with a spin coater. The silicon wafer was heated on a hot plate at 100° C. to 240° C. for 60 seconds or 90 seconds, to thereby form a resist underlayer film having a thickness of 150 nm. For evaluation of solvent resistance, the baked coating film was immersed in a solvent mixture of propylene glycol monomethyl ether and propylene glycol monomethyl ether acetate (7:3) for one minute, spin-dried, and then baked at 100° C. for 60 seconds. The thickness of the resultant film was measured to thereby calculate film remaining rate (Table 1).

TABLE 1

Solvent Resistance Test of Resist Underlayer Film

| Composition | Baking temperature (° C.) | Baking time (seconds) | Film remaining rate (%) |
|---|---|---|---|
| Comparative Example 2 | 240 | 90 | 2 |
| Comparative Example 3 | 240 | 90 | 3 |
| Example 1 | 100 | 60 | 0 |
| Example 2 | 240 | 90 | 1 |
| Example 3 | 240 | 90 | 0 |
| Example 4 | 240 | 90 | 8 |
| Example 5 | 240 | 90 | 0 |
| Example 6 | 240 | 90 | 0 |
| Example 7 | 240 | 90 | 0 |
| Example 8 | 240 | 90 | 3 |
| Example 9 | 240 | 90 | 0 |
| Example 10 | 240 | 90 | 0 |
| Example 11 | 240 | 90 | 1 |
| Example 12 | 240 | 90 | 0 |
| Example 13 | 240 | 90 | 0 |
| Example 14 | 240 | 90 | 0 |
| Example 15 | 240 | 90 | 0 |
| Example 16 | 240 | 90 | 0 |
| Example 17 | 240 | 90 | 0 |
| Example 18 | 240 | 90 | 0 |
| Example 19 | 170 | 60 | 0 |

As shown in the aforementioned results, solvent resistance is not achieved in the case of heating only. Thus, heating after application of a pattern can secure sufficient fluidity, thereby achieving planarity.

(Photocuring Test)

Each of the resist underlayer film-forming compositions prepared in Comparative Examples 2 and 3 and Examples 1 to 19 was applied onto a silicon wafer with a spin coater. The silicon wafer was heated on a hot plate at 100° C. to 240° C. for 60 seconds or 90 seconds, to thereby form a resist underlayer film having a thickness of 150 nm. The resist underlayer film was irradiated with ultraviolet rays at 500 mJ/cm$^2$ by using an ultraviolet irradiation apparatus including a UV irradiation unit (wavelength: 172 nm) available from USHIO INC. for determination of solvent resistance with photoirradiation (ultraviolet irradiation). For evaluation of solvent resistance, the ultraviolet-irradiated coating film was immersed in a solvent mixture of propylene glycol monomethyl ether and propylene glycol monomethyl ether acetate (7:3) for one minute, spin-dried, and then baked at 100° C. for one minute. Thereafter, the thickness of the film was measured, and the rate of film shrinkage through photoirradiation was calculated (Table 2). In Table 2, "NG" corresponds to a sample in which film roughening occurred after photoirradiation, and the correct film thickness was not measured.

TABLE 2

Evaluation of Photocuring Properties of Resist Underlayer Film

| Composition | Baking temperature (° C.) | Baking time (seconds) | Rate of film shrinkage (%) | Film remaining rate (%) |
|---|---|---|---|---|
| Comparative Example 2 | 240 | 90 | 1.8 | 99% or more |
| Comparative Example 3 | 240 | 90 | 0.6 | 99% or more |
| Example 1 | 100 | 60 | 0.4 | 99% or more |
| Example 2 | 240 | 90 | 0 | 99% or more |
| Example 3 | 240 | 90 | 2.1 | 99% or more |
| Example 4 | 240 | 90 | 0.2 | 99% or more |
| Example 5 | 240 | 90 | 0.1 | 7% |
| Example 6 | 240 | 90 | 0.5 | 99% or more |
| Example 7 | 240 | 90 | 0.4 | 54% |
| Example 8 | 240 | 90 | 0 | 99% or more |
| Example 9 | 240 | 90 | 0.1 | 99% or more |
| Example 10 | 240 | 90 | 0.1 | 5% |
| Example 11 | 240 | 90 | 1.0 | 99% or more |
| Example 12 | 240 | 90 | NG | NG |
| Example 13 | 240 | 90 | 0 | 0% |
| Example 14 | 240 | 90 | 0 | 0% |
| Example 15 | 240 | 90 | 1.6 | 99% or more |
| Example 16 | 240 | 90 | 0.9 | 99% or more |
| Example 17 | 240 | 90 | 0.8 | 99% or more |
| Example 18 | 240 | 90 | 0.1 | 99% or more |
| Example 19 | 170 | 60 | 1.5 | 99% or more |

As shown in the aforementioned results, a material that does not achieve curability only by heating exhibits curability through photoirradiation. The results of Examples 13 and 14 indicated that curability is not achieved only by baking or photoirradiation.

In order to improve the photocurability of the compositions of Examples 5, 7, 10, and 12, in which sufficient photocurability was not determined through the aforementioned procedure, the dose of light during photoirradiation was increased, and heating was performed during photoirradiation under experimental conditions similar to those described above. Thus, the photocurability of each composition was determined (Table 3). In each of the compositions of Examples 5, 7, 10, and 12, the dose of irradiated light and the temperature during photoirradiation were varied.

TABLE 3

Evaluation of Photocuring Properties of Resist Underlayer Film

| Composition | Baking temperature (° C.) | Baking time (seconds) | Dose of irradiated light (mJ/cm$^2$) | Temperature during photoirradiation (° C.) | Rate of film shrinkage (%) | Film remaining rate (%) |
|---|---|---|---|---|---|---|
| Example 5 | 240 | 90 | 500 | 23 | 0.1 | 7% |
| Example 5-1 | 240 | 90 | 500 | 50 | 0.5 | 65% |
| Example 5-2 | 240 | 90 | 1000 | 50 | 0.9 | 99% or more |
| Example 5-3 | 240 | 90 | 500 | 70 | 0.9 | 99% or more |
| Example 7 | 240 | 90 | 500 | 23 | 0.4 | 54% |
| Example 7-1 | 240 | 90 | 500 | 50 | 0.8 | 99% or more |
| Example 10 | 240 | 90 | 500 | 23 | 0.1 | 5% |
| Example 10-1 | 240 | 90 | 500 | 50 | 0.3 | 37% |
| Example 10-2 | 240 | 90 | 1000 | 50 | 0.8 | 58% |
| Example 10-3 | 240 | 90 | 500 | 70 | 1.3 | 99% or more |
| Example 12 | 240 | 90 | 500 | 23 | NG | NG |
| Example 12-1 | 240 | 90 | 500 | 50 | 0.1 | 41% |
| Example 12-2 | 240 | 90 | 1000 | 50 | 0.8 | 99% or more |
| Example 12-3 | 240 | 90 | 500 | 70 | 0.8 | 99% or more |

As shown in the aforementioned results, when a material having low photosensitivity is irradiated with an increased dose of light and heated during photoirradiation, the material can exhibit high photosensitivity and photocurability.

Each of the compositions of Examples 13 and 14 was irradiated with light at 172 nm and then baked at 120° C. for 90 seconds, to thereby determine its curability.

TABLE 4

Evaluation of Photocuring Properties of Resist Underlayer Film

| Composition | Baking temperature (° C.) | Baking time (seconds) | Dose of irradiated light (mJ/cm$^2$) | Temperature during photoirradiation (° C.) | Rate of film shrinkage (%) | Film remaining rate (%) |
|---|---|---|---|---|---|---|
| Example 13 | 240 | 90 | 500 | 23 | 0.6 | 99% or more |
| Example 14 | 240 | 90 | 500 | 23 | 2.1 | 97% |

As shown in the aforementioned results, when a material having low photosensitivity (i.e., a material having insufficient photocurability) is baked at low temperature after generation of an acid from a photoacid generator, the photocurability of the material can be improved.

(Evaluation of Planarity and Fillability on Stepped Substrate-1)

For evaluation of planarity on a stepped substrate, the thicknesses of a coating film were compared between a dense patterned area (DENSE) (trench width: 50 nm, pitch: 100 nm) and a non-patterned open area (OPEN) on an SiO$_2$ substrate having a thickness of 200 nm. Fillability was evaluated by observation of the DENSE area. Each of the resist underlayer film-forming compositions prepared in Comparative Examples 1 to 3 and Examples 2 to 18 was applied onto the aforementioned substrate, and then baked at 100° C. for 60 seconds or at 240° C. for 90 seconds, to thereby form a resist underlayer film having a thickness of about 150 nm. The resist underlayer film was irradiated with ultraviolet rays at 500 mJ/cm² or 1,000 mJ/cm² by using an ultraviolet irradiation apparatus including a UV irradiation unit (wavelength: 172 nm) available from USHIO INC. and was optionally heated during or after photoirradiation. The planarity of the stepped substrate was evaluated by observation with a scanning electron microscope (S-4800) available from Hitachi High-Technologies Corporation, and by measurement of the difference between the thickness of the substrate at the dense area (patterned area) and that at the open area (non-patterned area) (i.e., the difference in coating level between the dense area and the open area, which is called "Bias"). The term "planarity" refers to the case where a small difference is present between the thicknesses of portions of the coating film applied onto the patterned area (dense area) and the non-patterned area (open area); i.e., ISO-DENSE Bias is small (Table 5).

TABLE 5

Planarity and Fillability of Resist Underlayer Film

| Composition | DENSE Thickness (nm) | OPEN Thickness (nm) | DENSE/OPEN Difference in coating level (nm) | Fillability |
|---|---|---|---|---|
| Comparative Example 1 | 93 | 145 | 52 | ○ |
| Comparative Example 2 | 129 | 141 | 13 | ○ |
| Comparative Example 3 | 119 | 133 | 14 | ○ |
| Example 2 | 119 | 131 | 12 | ○ |
| Example 3 | 119 | 125 | 6 | ○ |
| Example 4 | 135 | 141 | 6 | ○ |
| Example 5 | 129 | 133 | 5 | ○ |
| Example 6 | 93 | 117 | 24 | ○ |
| Example 7 | 123 | 127 | 4 | ○ |
| Example 8 | 127 | 135 | 8 | ○ |
| Example 9 | 129 | 147 | 18 | ○ |
| Example 10 | 119 | 133 | 14 | ○ |
| Example 11 | 117 | 125 | 8 | ○ |
| Example 12 | 121 | 137 | 16 | ○ |
| Example 13 | 127 | 134 | 7 | ○ |
| Example 14 | 119 | 131 | 12 | ○ |
| Example 15 | 127 | 114 | 13 | ○ |
| Example 16 | 125 | 117 | 8 | ○ |
| Example 17 | 129 | 121 | 8 | ○ |
| Example 18 | 129 | 123 | 6 | ○ |

(Evaluation of Planarity and Fillability on Stepped Substrate-2)

For evaluation of planarity on a stepped substrate, the thicknesses of a coating film were compared between a dense patterned area (DENSE) (trench width: 50 nm, pitch: 100 nm) and a non-patterned open area (OPEN) on an SiO₂ substrate having a thickness of 200 nm. Fillability was evaluated by observation of the DENSE area. The resist underlayer film-forming composition prepared in Example 19 was applied onto the aforementioned substrate, and then baked at 170° C. for 60 seconds or at 240° C. for 90 seconds, to thereby form a resist underlayer film having a thickness of about 150 nm. The resist underlayer film was irradiated with ultraviolet rays at 500 mJ/cm² or 1,000 mJ/cm² by using an ultraviolet irradiation apparatus including a UV irradiation unit (wavelength: 172 nm) available from USHIO INC. The planarity of the stepped substrate was evaluated by observation with a scanning electron microscope (S-4800) available from Hitachi High-Technologies Corporation, and by measurement of the difference between the thickness of the substrate at the dense area (patterned area) and that at the open area (non-patterned area) (i.e., the difference in coating level between the dense area and the open area, which is called "Bias"). The term "planarity" refers to the case where a small difference is present between the thicknesses of portions of the coating film applied onto the patterned area (dense area) and the non-patterned area (open area); i.e., ISO-DENSE Bias is small (Table 5-1).

TABLE 5-1

Planarity and Fillability of Resist Underlayer Film

| Composition | DENSE Thickness (nm) | OPEN Thickness (nm) | DENSE/OPEN Difference in coating level (nm) | Fillability |
|---|---|---|---|---|
| Example 19 | 146 | 152 | 6 | ○ |

(Evaluation of Planarity and Fillability during Application of Upper Layer Film-1)

For evaluation of planarity during application of an upper layer film, the thicknesses of a coating film were compared between an 800 nm trench area (TRENCH) and a non-patterned open area (OPEN) on an SiO₂ substrate having a thickness of 200 nm. Fillability was evaluated at a dense patterned area (DENSE) (trench width: 50 nm, pitch: 100 nm). Each of the resist underlayer film-forming compositions prepared in Comparative Examples 2 and 3 and Examples 2, 3, 4, 8, 11, and 13 to 18 was applied onto the aforementioned substrate, and then baked at 240° C. for 90 seconds, to thereby form a resist underlayer film having a thickness of about 150 nm. The resist underlayer film was irradiated with ultraviolet rays at 500 mJ/cm² by using an ultraviolet irradiation apparatus including a UV irradiation unit (wavelength: 172 nm) available from USHIO INC. Subsequently, a silicon material was applied onto the resist underlayer film by spin coating and baked at 215° C. for 60 seconds, to thereby form an inorganic film having a thickness of about 30 nm. The planarity of the stepped substrate was evaluated by observation with a scanning electron microscope (S-4800) available from Hitachi High-Technologies Corporation, and by measurement of the difference between the thickness of the substrate at the trench area (patterned area) and that at the open area (non-patterned area) (i.e., the difference in coating level between the trench area and the open area, which is called "Bias"). The term "planarity" refers to the case where a small difference is present between the thicknesses of portions of the coating film applied onto the patterned area (trench area) and the non-patterned area (open area); i.e., ISO-DENSE Bias (difference in coating level: nm) is small (Table 6).

Fillability was evaluated as "○" in the case of filling without occurrence of voids, or evaluated as "X" in the case of occurrence of voids.

TABLE 6

Planarity and Fillability of Resist Underlayer Film

| Composition | OPEN Thickness (nm) | TRENCH Thickness (nm) | TRENCH/OPEN Difference in coating level (nm) | Fillability |
|---|---|---|---|---|
| Comparative Example 2 | 179 | 169 | 10 | x |
| Comparative Example 3 | 175 | 125 | 50 | ○ |
| Example 2 | 153 | 121 | 32 | ○ |

TABLE 6-continued

Planarity and Fillability of Resist Underlayer Film

| Composition | OPEN Thickness (nm) | TRENCH Thickness (nm) | TRENCH/OPEN Difference in coating level (nm) | Fillability |
|---|---|---|---|---|
| Example 3 | 165 | 141 | 24 | ○ |
| Example 4 | 183 | 151 | 32 | ○ |
| Example 8 | 153 | 133 | 20 | ○ |
| Example 11 | 152 | 123 | 29 | ○ |
| Example 13 | 155 | 135 | 20 | ○ |
| Example 14 | 177 | 161 | 16 | ○ |

TABLE 6-continued

Planarity and Fillability of Resist Underlayer Film

| Composition | OPEN Thickness (nm) | TRENCH Thickness (nm) | TRENCH/OPEN Difference in coating level (nm) | Fillability |
|---|---|---|---|---|
| Example 15 | 167 | 149 | 18 | ○ |
| Example 16 | 167 | 139 | 28 | ○ |
| Example 17 | 165 | 129 | 36 | ○ |
| Example 18 | 173 | 136 | 37 | ○ |

(Evaluation of Planarity and Fillability During Application of Upper Layer Film-2)

For evaluation of planarity during application of an upper layer film, the thicknesses of a coating film were compared between an 800 nm trench area (TRENCH) and a non-patterned open area (OPEN) on an SiO$_2$ substrate having a thickness of 200 nm. Fillability was evaluated at a dense patterned area (DENSE) (trench width: 50 nm, pitch: 100 nm). The resist underlayer film-forming composition prepared in Comparative Example 4 and Example 19 was applied onto the aforementioned substrate, and then baked at 240° C. for 90 seconds, to thereby form a resist underlayer film having a thickness of about 150 nm. While the resist underlayer film was heated at a temperature during photoirradiation described below, the film was irradiated with ultraviolet rays at 500 mJ/cm$^2$ by using an ultraviolet irradiation apparatus including a UV irradiation unit (wavelength: 172 nm) available from USHIO INC. Subsequently, a silicon material was applied onto the resist underlayer film by spin coating and baked at 215° C. for 60 seconds, to thereby form an inorganic film having a thickness of about 30 nm. The planarity of the stepped substrate was evaluated by observation with a scanning electron microscope (S-4800) available from Hitachi High-Technologies Corporation, and by measurement of the difference between the thickness of the substrate at the trench area (patterned area) and that at the open area (non-patterned area) (i.e., the difference in coating level between the trench area and the open area, which is called "Bias"). The term "planarity" refers to the case where a small difference is present between the thicknesses of portions of the coating film applied onto the patterned area (trench area) and the non-patterned area (open area); i.e., ISO-DENSE Bias (difference in coating level: nm) is small (Table 6-1).

Fillability was evaluated as "○" in the case of filling without occurrence of voids, or evaluated as "X" in the case of occurrence of voids.

In Comparative Examples 4 and 5 and Example 19-1, the composition of Example 19 was used, and the temperature during photoirradiation was varied.

TABLE 6-1

Planarity and Fillability of Resist Underlayer Film

| Composition | Temperature during photoirradiation (° C.) | OPEN Thickness (nm) | TRENCH Thickness (nm) | TRENCH/OPEN Difference in coating level (nm) | Fillability |
|---|---|---|---|---|---|
| Comparative Example 4 | 23 | 161 | 101 | 60 | ○ |
| Comparative Example 5 | 30 | 163 | 113 | 50 | ○ |
| Example 19 | 40 | 167 | 135 | 32 | ○ |
| Example 19-1 | 50 | 167 | 145 | 22 | ○ |

The difference in coating level (nm) between the trench area and the open area and the difference in coating level (nm) between the dense area and the open area are preferably less than 50 nm, or 40 nm or less, or 30 nm or less.

In the case of heating during or after photoirradiation; i.e., heating of the resist underlayer film during photoirradiation, or heating of the film after photoirradiation (for example, in the case of coating of the resist underlayer film with a silicon-containing inorganic film), the entire process during or after photoirradiation is preferably performed within the heating temperature range.

INDUSTRIAL APPLICABILITY

The stepped substrate coating composition of the present invention can fill a pattern sufficiently and can form a coating film without causing degassing or thermal shrinkage, and thus can be used for forming a coating film having planarity on a substrate.

The invention claimed is:

1. A stepped substrate coating composition comprising a main agent and a solvent, the main agent containing a compound (A), a compound (B), or a mixture of these compounds, the compound (A) having a partial structure of the following Formula (A-1) or (A-2):

Formula (A-1)

-continued

Formula (A-2)

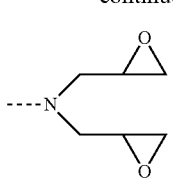

(wherein n is an integer of 1 or 2; a broken line is a bond to an aromatic ring; and the aromatic ring is an aromatic ring selected from the group consisting of a benzene ring, a naphthalene ring, and an anthracene ring and forming a polymer skeleton or a monomer, and wherein the polymer containing the aromatic ring is prepared by substitution of a hydroxyl group of a polymer having a hydroxyaryl novolac structure with an organic group of Formula (A-1) or (A-2), and the monomer containing the aromatic ring is prepared by substitution of a hydroxyl group of the aromatic ring with an organic group of Formula (A-1) or (A-2)), and the compound (B) having at least one partial structure selected from the group consisting of partial structures of the following Formulae (B-1) to (B-5), or having a partial structure including a combination of a partial structure of the following Formula (B-6) and a partial structure of the following Formula (B-7) or (B-8):

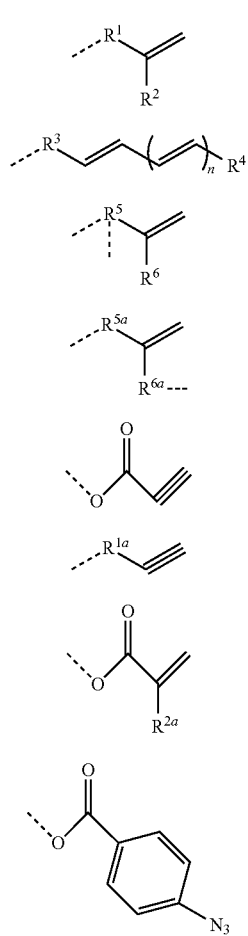

(wherein $R^1$, $R^{1a}$, $R^3$, $R^5$, $R^{5a}$, and $R^{6a}$ are each independently a $C_{1-10}$ saturated hydrocarbon group, a $C_{6-40}$ aromatic hydrocarbon group, an oxygen atom, a carbonyl group, a sulfur atom, a nitrogen atom, an amide group, an amino group, or a group composed of any combination of these; $R^2$, $R^{2a}$, $R^4$, and $R^6$ are each independently a hydrogen atom, a $C_{1-10}$ saturated hydrocarbon group, a $C_{2-10}$ unsaturated hydrocarbon group, an oxygen atom, a carbonyl group, an amide group, an amino group, or a group composed of any combination of these; $R^2$, $R^{2a}$, $R^4$, and $R^6$ are each a monovalent group; $R^1$, $R^{1a}$, $R^5$, $R^{5a}$, and $R^{6a}$ are each a divalent group; $R^5$ is a trivalent group; n is a repeating unit number of 1 to 10; and a dotted line is a chemical bond to an adjacent atom), wherein when the main agent contains the compound (A) or a mixture of the compound (A) and the compound (B), the composition is cured by photoirradiation, or cured by heating at 30° C. to 300° C. during or after photoirradiation;

when the main agent contains the compound (B), the composition is cured by heating at 30° C. to 300° C. during or after photoirradiation; and the amount of the main agent in the solid content of the composition is 95% by mass to 100% by mass.

2. The stepped substrate coating composition according to claim 1, wherein, when the main agent is a mixture of the compound (A) and the compound (B), the ratio by mole of an epoxy group to a vinyl group is 100:1 to 1:100.

3. The stepped substrate coating composition according to claim 1, wherein the composition further comprises an acid generator.

4. The stepped substrate coating composition according to claim 1, wherein the composition further comprises a surfactant.

5. The stepped substrate coating composition according to claim 1, wherein the aromatic ring forms a polymer skeleton.

6. The stepped substrate coating composition according to claim 1, wherein the aromatic ring forms a monomer.

7. The stepped substrate coating composition according to claim 1, wherein the main agent contains a mixture of the compound (A) and the compound (B).

8. A method for producing a coated substrate, the method comprising a step (i) of applying the stepped substrate coating composition according to claim 1 to a stepped substrate; and a step (ii) of exposing the composition applied in the step (i) to light or heating the composition during or after light exposure.

9. The method for producing a coated substrate according to claim 8, wherein the method further comprises a step (ia) of heating the stepped substrate coating composition at a temperature of 70° C. to 400° C. for 10 seconds to five minutes after application of the composition in the step (i).

10. The method for producing a coated substrate according to claim 8, wherein light used for the light exposure in the step (ii) has a wavelength of 150 nm to 248 nm.

11. The method for producing a coated substrate according to claim 8, wherein the dose of exposure light in the step (ii) is 10 mJ/cm$^2$ to 5,000 mJ/cm$^2$.

12. The method for producing a coated substrate according to claim 8, wherein the substrate has an open area (non-patterned area) and a patterned area of DENSE (dense) and ISO (coarse), and the pattern has an aspect ratio of 0.1 to 100.

13. The method for producing a coated substrate according to claim 8, wherein the difference in coating level (Bias) between the open area and the patterned area is 1 nm to 50 nm.

14. A method for producing a semiconductor device, the method comprising a step of forming, on a stepped substrate, an underlayer film from the stepped substrate coating composition according to claim 1; a step of forming a resist film on the underlayer film; a step of irradiating the resist film with light or electron beams, or heating the resist film during or after irradiation with light or electron beams, and then developing the resist film, to thereby form a resist pattern; a step of etching the underlayer film with the formed resist pattern; and a step of processing a semiconductor substrate with the patterned underlayer film.

15. The method for producing a semiconductor device according to claim 14, wherein the stepped substrate has an open area (non-patterned area) and a patterned area of DENSE (dense) and ISO (coarse), and the pattern has an aspect ratio of 0.1 to 100.

16. The method for producing a semiconductor device according to claim 14, wherein the step of forming an underlayer film from the stepped substrate coating composition comprises a step (i) of applying the stepped substrate coating composition to the stepped substrate; and a step (ii) of exposing the composition applied in the step (i) to light or heating the composition during or after light exposure.

17. The method for producing a semiconductor device according to claim 16, wherein the method further comprises a step (ia) of heating the stepped substrate coating composition at a temperature of 70° C. to 400° C. for 10 seconds to five minutes after application of the composition in the step (i).

18. The method for producing a semiconductor device according to claim 16, wherein light used for the light exposure in the step (ii) has a wavelength of 150 nm to 248 nm.

19. The method for producing a semiconductor device according to claim 16, wherein the dose of exposure light in the step (ii) is 10 mJ/cm$^2$ to 5,000 mJ/cm$^2$.

20. The method for producing a semiconductor device according to claim 14, wherein the underlayer film formed from the stepped substrate coating composition has a difference in coating level of 1 nm to 50 nm.

21. A method for producing a semiconductor device, the method comprising a step of forming, on a stepped substrate, an underlayer film from the stepped substrate coating composition according to claim 1; a step of forming a hard mask on the underlayer film; a step of forming a resist film on the hard mask; a step of irradiating the resist film with light or electron beams, or heating the resist film during or after irradiation with light or electron beams, and then developing the resist film, to thereby form a resist pattern; a step of etching the hard mask with the formed resist pattern; a step of etching the underlayer film with the patterned hard mask; and a step of processing a semiconductor substrate with the patterned underlayer film.

22. The method for producing a semiconductor device according to claim 21, wherein the stepped substrate has an open area (non-patterned area) and a patterned area of DENSE (dense) and ISO (coarse), and the pattern has an aspect ratio of 0.1 to 100.

23. The method for producing a semiconductor device according to claim 21, wherein the step of forming an underlayer film from the stepped substrate coating composition comprises a step (i) of applying the stepped substrate coating composition to the stepped substrate; and a step (ii) of exposing the composition applied in the step (i) to light or heating the composition during or after light exposure.

24. The method for producing a semiconductor device according to claim 23, wherein the method further comprises a step (ia) of heating the stepped substrate coating composition at a temperature of 70° C. to 400° C. for 10 seconds to five minutes after application of the composition in the step (i).

25. The method for producing a semiconductor device according to claim 23, wherein light used for the light exposure in the step (ii) has a wavelength of 150 nm to 248 nm.

26. The method for producing a semiconductor device according to claim 23, wherein the dose of exposure light in the step (ii) is 10 mJ/cm$^2$ to 5,000 mJ/cm$^2$.

27. The method for producing a semiconductor device according to claim 21, wherein the underlayer film formed from the stepped substrate coating composition has a difference in coating level of 1 nm to 50 nm.

* * * * *